United States Patent
Cheah et al.

(10) Patent No.: US 10,748,854 B2
(45) Date of Patent: Aug. 18, 2020

(54) STAIRSTEP INTERPOSERS WITH INTEGRATED SHIELDING FOR ELECTRONICS PACKAGES

(71) Applicant: Intel Corporation, Santa Clara, CA (US)

(72) Inventors: Bok Eng Cheah, Penang (MY); Hungying Louis Lo, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/079,534

(22) PCT Filed: Mar. 16, 2016

(86) PCT No.: PCT/US2016/022549
§ 371 (c)(1),
(2) Date: Aug. 23, 2018

(87) PCT Pub. No.: WO2017/160284
PCT Pub. Date: Sep. 21, 2017

(65) Prior Publication Data
US 2019/0057940 A1    Feb. 21, 2019

(51) Int. Cl.
*H01L 23/552* (2006.01)
*H01L 25/065* (2006.01)
(Continued)

(52) U.S. Cl.
CPC .......... *H01L 23/552* (2013.01); *H01L 21/481* (2013.01); *H01L 21/4857* (2013.01);
(Continued)

(58) Field of Classification Search
CPC ................. H01L 23/5386; H01L 25/117
See application file for complete search history.

(56) References Cited

U.S. PATENT DOCUMENTS 6,492,726 B1    12/2002  Quek et al.
8,354,743 B2 *  1/2013  Jensen ............... H01L 25/0657
                                                 257/686
(Continued)

FOREIGN PATENT DOCUMENTS

EP    2019427 A1    1/2009
EP    2164311 A1    3/2010
(Continued)

OTHER PUBLICATIONS

International Search Report and Written Opinion issued in PCT Application No. PCT/US2016/022549 dated Nov. 21, 2016; 12 pages.
(Continued)

*Primary Examiner* — Yu-Hsi D Sun
(74) *Attorney, Agent, or Firm* — Patent Capital Group

(57) ABSTRACT

Disclosed herein are stairstep interposers with integrated conductive shields, and related assemblies and techniques. In some embodiments, an interposer may include: an insulating material having a stairstep structure with a first step surface, a second step surface, and a bottom surface to face a package substrate, wherein a first thickness of the insulating material between the first step surface and the bottom surface is greater than a second thickness of the insulating material between the second step surface and the bottom surface; a conductive signal pathway extending from the first step surface to the bottom surface; and a conductive shield disposed within the insulating material to shield the conductive signal pathway.

25 Claims, 12 Drawing Sheets

(51) Int. Cl.
    *H01L 23/60*     (2006.01)
    *H01L 23/498*     (2006.01)
    *H01L 21/48*     (2006.01)
    *H01L 23/31*     (2006.01)
    *H01L 23/538*     (2006.01)
    *H01L 23/00*     (2006.01)
    *H01L 25/00*     (2006.01)
    *H01L 23/29*     (2006.01)
    *H01L 25/10*     (2006.01)
    *H01L 25/18*     (2006.01)

(52) U.S. Cl.
    CPC .... *H01L 23/3128* (2013.01); *H01L 23/49833* (2013.01); *H01L 23/49838* (2013.01); *H01L 23/5383* (2013.01); *H01L 23/5386* (2013.01); *H01L 23/60* (2013.01); *H01L 24/73* (2013.01); *H01L 25/065* (2013.01); *H01L 25/0652* (2013.01); *H01L 25/0657* (2013.01); *H01L 25/50* (2013.01); *H01L 23/293* (2013.01); *H01L 23/296* (2013.01); *H01L 23/3114* (2013.01); *H01L 23/49811* (2013.01); *H01L 23/49894* (2013.01); *H01L 24/16* (2013.01); *H01L 24/17* (2013.01); *H01L 24/32* (2013.01); *H01L 24/33* (2013.01); *H01L 25/105* (2013.01); *H01L 25/18* (2013.01); *H01L 2224/16227* (2013.01); *H01L 2224/16237* (2013.01); *H01L 2224/16238* (2013.01); *H01L 2224/32145* (2013.01); *H01L 2224/73203* (2013.01); *H01L 2225/06548* (2013.01); *H01L 2225/06562* (2013.01); *H01L 2225/06565* (2013.01); *H01L 2225/06568* (2013.01); *H01L 2225/06586* (2013.01); *H01L 2225/107* (2013.01)

(56) References Cited

U.S. PATENT DOCUMENTS

| | | |
|---|---|---|
| 2005/0263238 A1 | 12/2005 | Takase et al. |
| 2007/0235215 A1 | 10/2007 | Bathan et al. |
| 2013/0277831 A1 | 10/2013 | Yoon et al. |
| 2013/0333934 A1 | 12/2013 | Hurwitz et al. |
| 2014/0021591 A1 | 1/2014 | Sung et al. |
| 2014/0197545 A1 | 7/2014 | Chase et al. |
| 2015/0091176 A1 | 4/2015 | Otremba et al. |
| 2015/0364405 A1 | 12/2015 | Kunimoto et al. |
| 2018/0204821 A1 | 7/2018 | Guo et al. |

FOREIGN PATENT DOCUMENTS

| | | |
|---|---|---|
| KR | 20020028018 A | 4/2002 |
| KR | 20050117715 A | 12/2005 |
| KR | 20100088514 A | 8/2010 |

OTHER PUBLICATIONS

European Extended Search Report issued in European Application No. 16894743.0 dated Nov. 4, 2019; 10 pages.

* cited by examiner

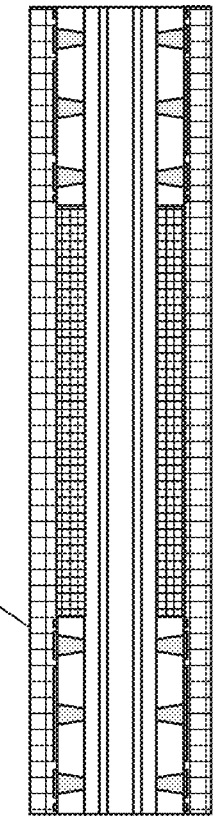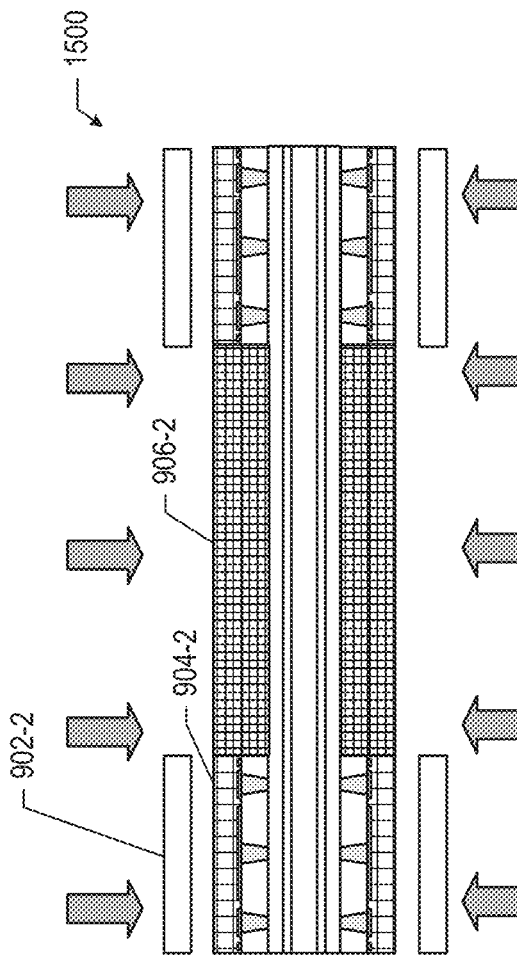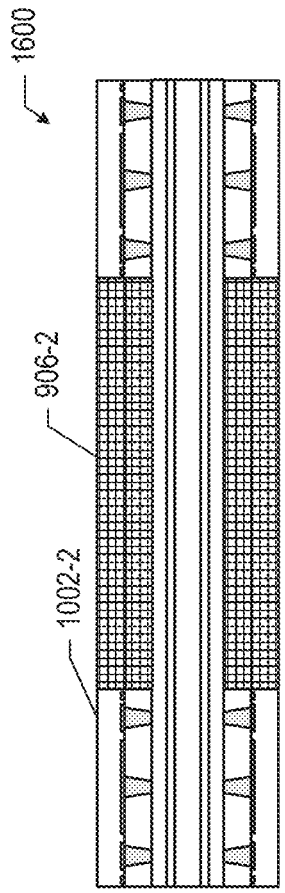

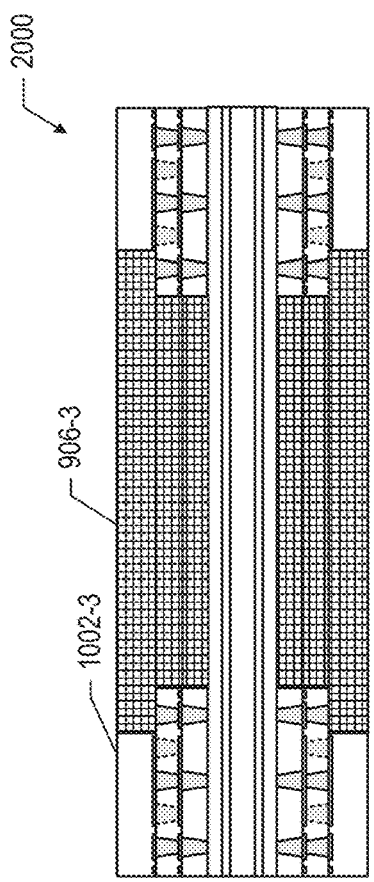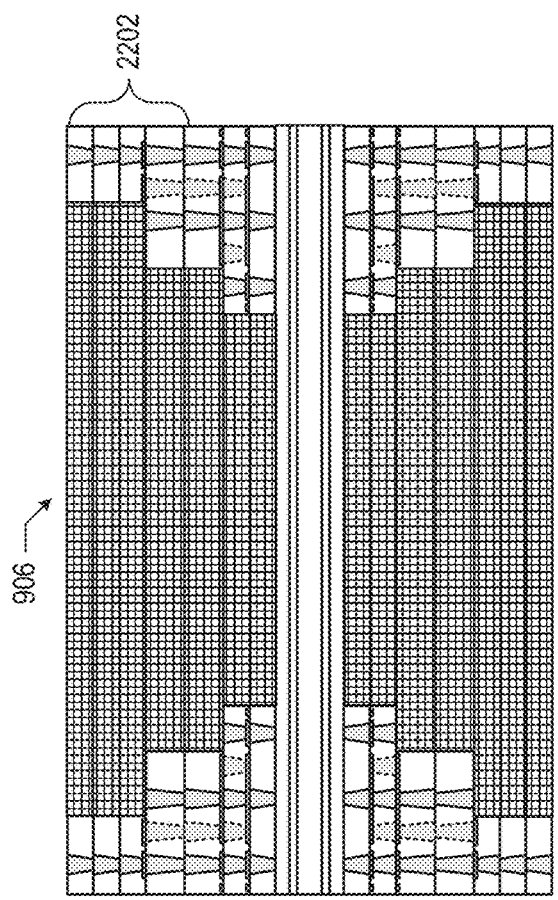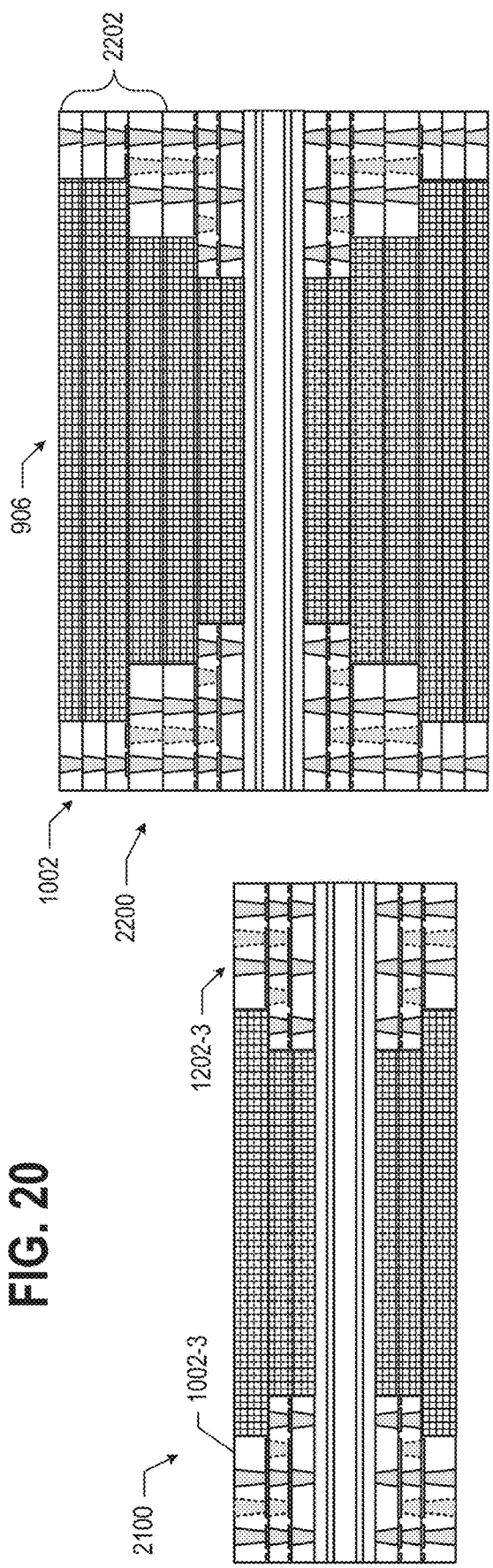
FIG. 20
FIG. 21
FIG. 22

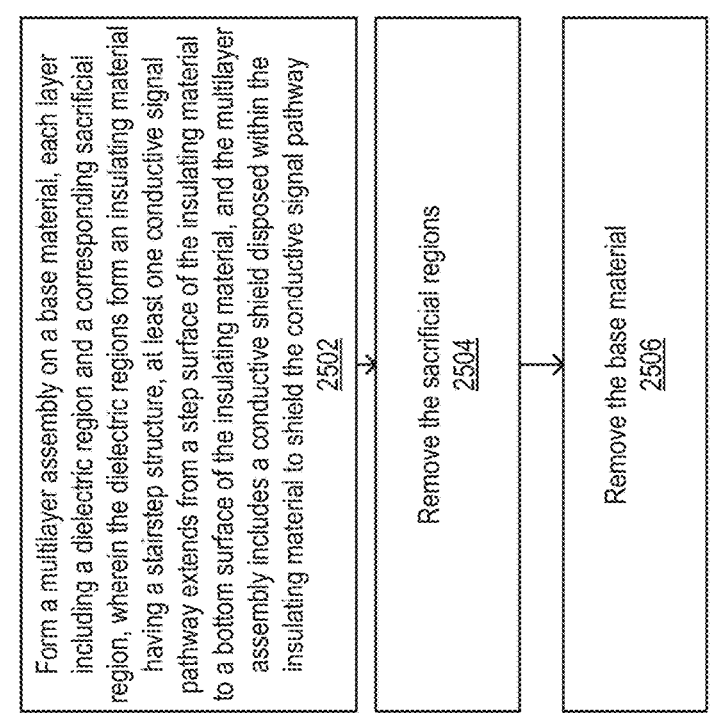
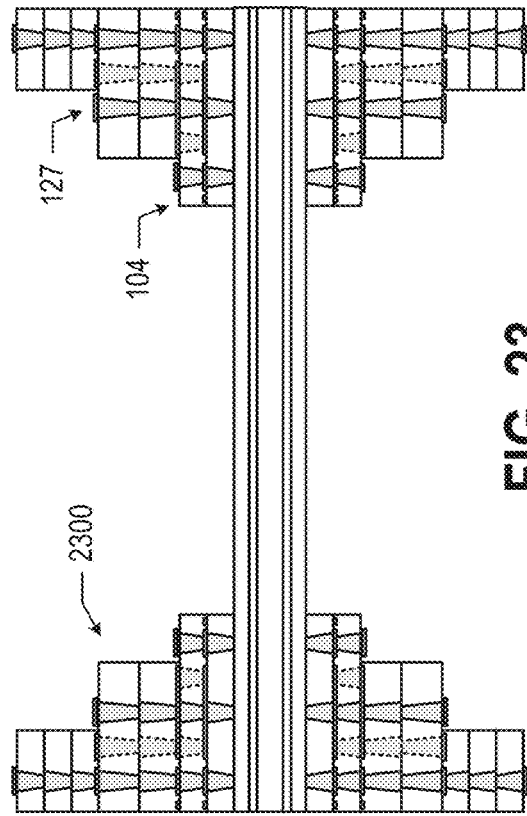
FIG. 23
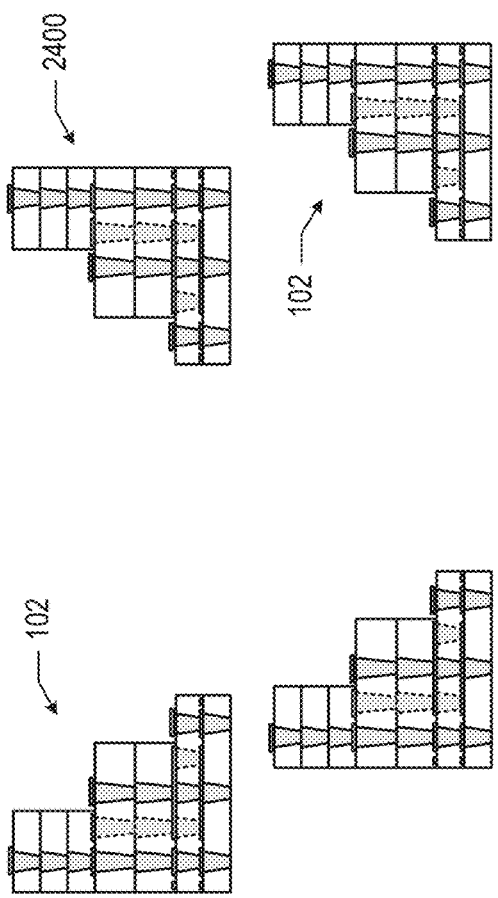
FIG. 24
FIG. 25

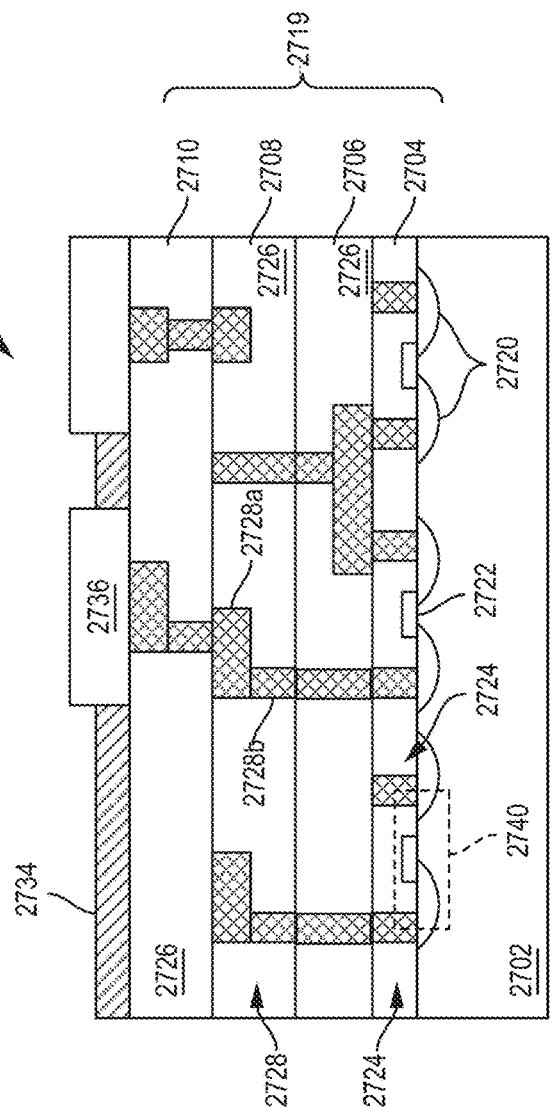
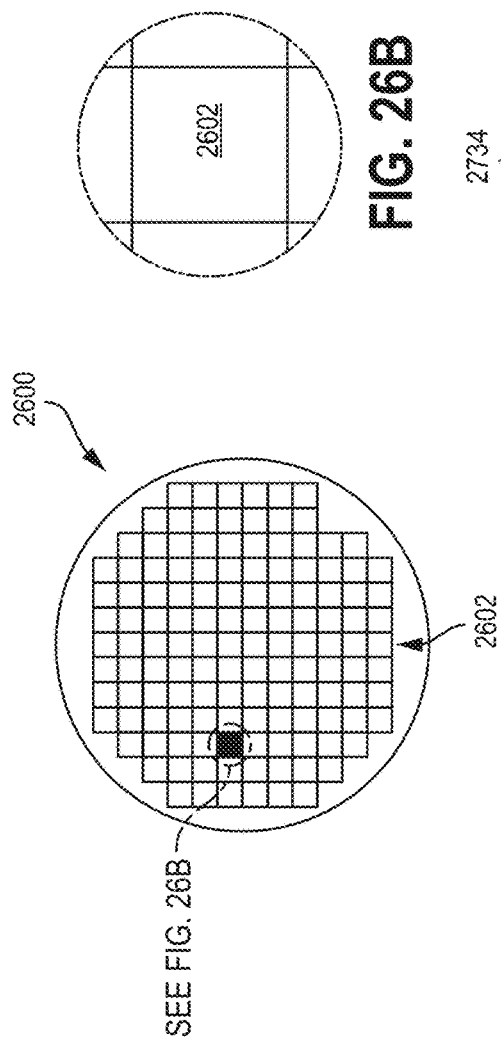

STAIRSTEP INTERPOSERS WITH INTEGRATED SHIELDING FOR ELECTRONICS PACKAGES

CROSS-REFERENCE TO RELATED APPLICATION

This application is a national stage application under 35 § 371 of PCT International Application Serial No. PCT/US2016/022549, filed on Mar. 16, 2016 and entitled "STAIRSTEP INTERPOSERS WITH INTEGRATED SHEILDING FOR ELECTRONICS PACKAGES," which is hereby incorporated by reference in its entirety.

TECHNICAL FIELD

The present disclosure relates generally to electronics packages, and more particularly, to stairstep interposers with integrated shielding.

BACKGROUND

Some electronics packages include multiple dies arranged in the stack on top of a package substrate. Conventionally, electrical connections between the package substrate and the dies higher up in the stack may route through intermediate dies in the stack (e.g., through one or more through-silicon vias) or through wire bond connections directly between the dies and the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 7-24 are side cross-sectional views of various assemblies during an example process for manufacturing the stairstep interposer of FIG. 1, in accordance with various embodiments.

FIG. 25 is a flow diagram of a method of manufacturing a stairstep interposer with integrated shielding, in accordance with various embodiments.

FIGS. 26A and 26B are top views of a wafer and dies that may be included in an electronics package having a stairstep interposer in accordance with any of the embodiments disclosed herein.

FIG. 27 is a cross-sectional side view of an integrated circuit (IC) device that may be included in an electronics package having a stairstep interposer in accordance with any of the embodiments disclosed herein.

DETAILED DESCRIPTION

Figure 1:
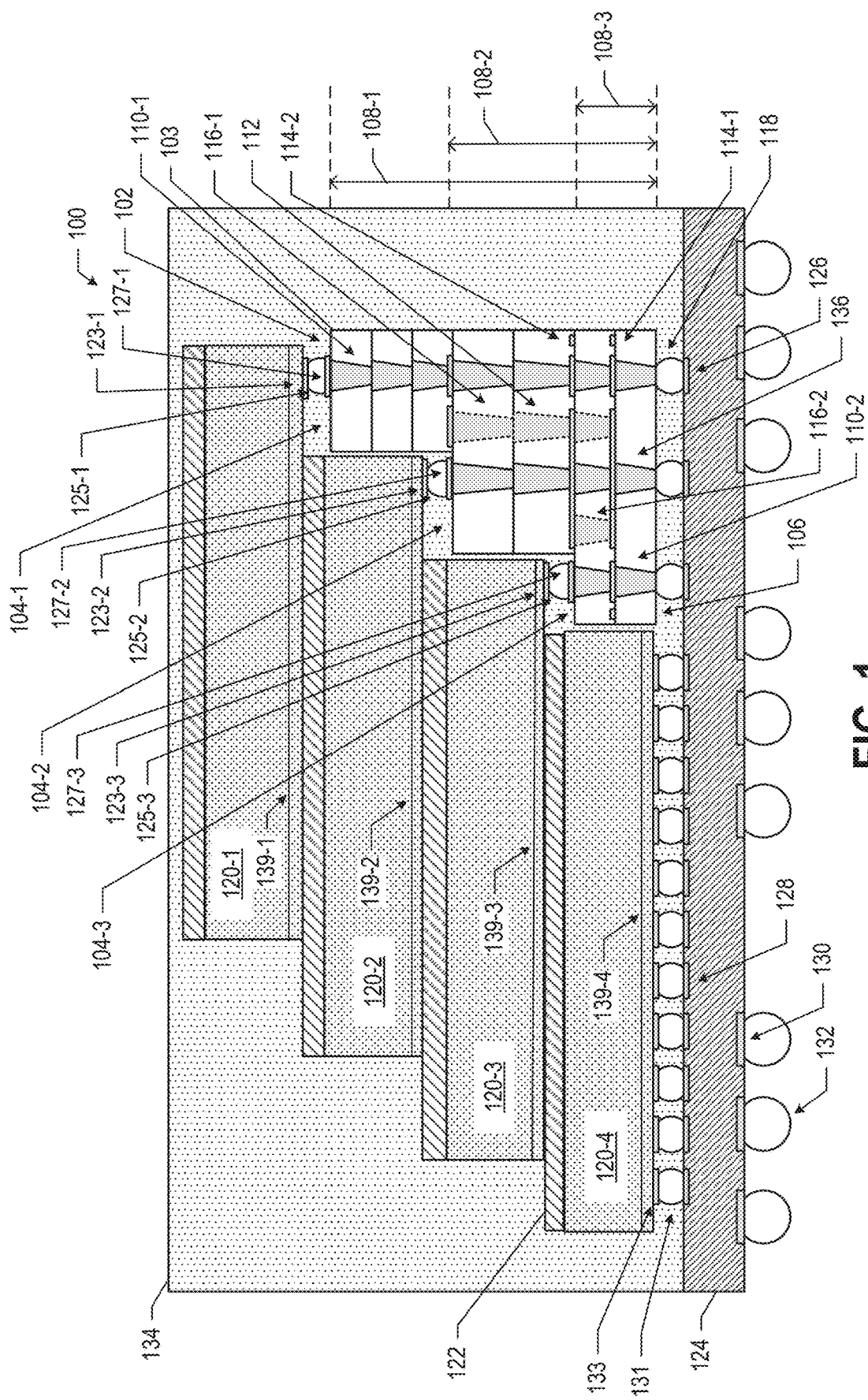
FIG. 1 is a side cross-sectional view of an electronics package including a stairstep interposer with an integrated conductive shield, in accordance with various embodiments.

Disclosed herein are stairstep interposers with integrated shielding, and related assemblies and techniques. In some embodiments, an interposer may include: an insulating material having a stairstep structure with a first step surface, a second step surface, and a bottom surface to face a package substrate, wherein a first thickness of the insulating material between the first step surface and the bottom surface is greater than a second thickness of the insulating material between the second step surface and the bottom surface; a conductive signal pathway extending from the first step surface to the bottom surface; and a conductive shield disposed within the insulating material to shield the conductive signal pathway.

As noted above, some electronics packages may include multiple dies arranged in the stack on top of a package substrate. In some conventional ones of such electronics packages, electrical connections between the package substrate and the dies higher up in the stack may route through intermediate dies in the stack (e.g., through one or more through-silicon vias). However, the use of through-silicon vias may incur significant expense and difficulty in the manufacturing process. In other conventional stacked-die electronics packages, the dies in the stack may be staggered with respect to each other, and wire bond connections may directly couple each die with the package substrate. These "vertical" wire bonds are also difficult to manufacture, often resulting in low yields. Moreover, both of these conventional approaches may be susceptible to mechanical failure as electronics packages become thinner.

Various ones of the embodiments disclosed herein provide in-package interposers to which multiple dies may be coupled. These interposers may include "vertical" communication pathways between the dies and the package substrate, as well as integrated shielding structures to electromagnetically shield these conductive pathways within the interposer to mitigate crosstalk. These interposers may also provide mechanical support to the package by acting as a stiffener and reducing the likelihood of mechanical failure due to warpage. The additional stiffening provided by various ones of the interposers disclosed herein may be particularly advantageous in ultra-thin or coreless package substrates, for example. Moreover, the manufacturing techniques used to manufacture the interposers and assemble them into an electronics package may exhibit improved throughput time and yield relative to conventional approaches. For example, some embodiments of the interposers disclosed herein may be tested at the panel level (when multiple interposers are part of a larger assembly, before singulation), which may be significantly faster than the individual testing used for packages in which stacked dies are coupled to a package substrate via wire bonding.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "electronics package" are synonymous.

FIG. 1 is a side cross-sectional view of an electronics package 100 including a stairstep interposer 102 with an integrated conductive shield 112, in accordance with various embodiments. The "stairstep interposer 102" may also be referred to as the "interposer 102" herein. The stairstep interposer 102 may include an insulating material 103 having a stairstep structure with one or more step surfaces 104 and a bottom surface 106. In particular, the embodiment illustrated in FIG. 1 includes three step surfaces 104-1, 104-2, and 104-3. The thickness 108-1 of the insulating material 103 between the step surface 104-1 and the bottom surface 106 may be greater than the thickness 108-2 of the insulating material 103 between the step surface 104-2 and the bottom surface 106, which may in turn be greater than the thickness 108-3 of the insulating material 103 between the step surface 104-3 and the bottom surface 106. Although FIG. 1 depicts an embodiment with three step surfaces 104, an interposer 102 may include any desired number of step surfaces 104. As illustrated in FIG. 1, the stairstep structure of the insulating material 103 may be formed by multiple layers of the insulating material 103; an example manufacturing process is discussed below with reference to FIGS. 7-24. The insulating material 103 may be a dielectric material, such as bismaleimide triazine, polyester or silicone composites. In some embodiments, glass cloth fibers or other additives may be included in the insulating material 103 to provide further mechanical rigidity to the interposer 102.

The stairstep interposer 102 may include one or more conductive signal pathways 110. The conductive signal pathways 110 may extend between an associated step surface 104 and the bottom surface 106, and may serve to provide an electrical pathway for signals originating from or destined for a die 120 coupled to the step surface 104. For example, FIG. 1 illustrates a conductive signal pathway 110-1 extending between the step surface 104-1 and the bottom surface 106. The active metal layer 139-1 of the die 120-1 may signal over the conductive signal pathway 110-1 via the conductive contact 123-1, the solder 125-1, and the conductive contact 127-1 of the interposer 102. The conductive contacts 123 disclosed herein may be silicon metal pads in some embodiments. FIG. 1 also illustrates a conductive signal pathway 110-2 extending between the step surface 104-3 and the bottom surface 106. The active metal layer 139-3 of the die 120-3 may signal over the conductive signal pathway 110-2 via the conductive contact 123-3, the solder 125-3, and the conductive contact 127-3 of the interposer 102. The conductive signal pathways 110 may each be communicatively coupled to conductive contacts 126 of a package substrate 124 via solder 118. The conductive contacts 126 of the package substrate 124, and/or the conductive contacts 127 of the interposer 102, may be metal pads, in some embodiments.

The package substrate 124 may include further conductive pathways (not shown) to route signals from the stairstep interposer 102 (e.g., from the conductive signal pathways 110) to the conductive contacts 130, and from there to another component to which the electronics package 100 is coupled via the solder 132 (e.g., a circuit board, an interposer, or another package). In some embodiments, the solder 132 may take the form of a solder ball. The conductive pathways disclosed herein may be formed of any suitable material, such as a metal (e.g., copper) or other electrically conductive material. The package substrate 124 may be formed of any suitable substrate materials, such as any of the insulating materials 103 discussed above with reference to the interposer 102.

The dies 120 included in the electronics package 100 may take any suitable form. For example one or more of the dies 120 may be a memory die, a logic die (e.g., a central processing unit (CPU) or other processor), a sensor die, or a platform controller hub, or may include any combination of circuits having these functions.

The interposer 102 may also include one or more conductive reference pathways 136. The conductive reference pathways 136 may provide an electrical pathway for a reference voltage, such as ground or a power supply voltage. As discussed above with reference to the conductive signal pathways 110, the conductive reference pathways 136 may extend between an associated step surface 104 and the bottom surface 106, and may serve to provide an electrical pathway for a reference voltage for a die 120 coupled to the step surface 104. For example, FIG. 1 illustrates a conductive reference pathway 136 extending between the step surface 104-2 and the bottom surface 106. The active metal layer 139-2 of the die 120-2 may couple to the conductive reference pathway 136 via the conductive contact 123-2, the solder 125-2, and the conductive contact 127-2 of the interposer 102. The conductive reference pathways 136 may each be communicatively coupled to conductive contacts 126 of a package substrate 124 via solder 118, as discussed above with reference to the conductive signal pathways 110. The solder 118 may take the form of solder bumps, for example. The package substrate 124 may include further conductive pathways (not shown) to route signals from the stairstep interposer 102 (e.g., from the conductive reference pathways 136) to the conductive contacts 130, and from there to another component to which the electronics package 100 is coupled via the solder 132 (e.g., a circuit board, an interposer, or another package).

As discussed above, the electronics package 100 may include one or more dies 120. Some of the dies 120 may be coupled to a step surface 104 of the interposer 102. For example, in the embodiment illustrated in FIG. 1, the die 120-1 may be coupled to the step surface 104-1, the die 120-2 may be coupled to the step surface 104-2, and the die 120-3 may be coupled to the step surface 104-3. The electronics package 100 may include one or more dies 120 that are not directly coupled to the interposer 102 (e.g., there is no conductive pathway between the dies 120 and the package substrate 124 that route through the interposer 102). For example, in the embodiment illustrated in FIG. 1, the die 120-4 may include conductive contacts 133 (in electrical communication with the active metal layer 139-4 of the die 120-4) coupled to conductive contacts 128 of the package substrate 124 via solder 131. In some embodiments, the solder 131 may be controlled collapse chip connection (C4) bumps, or other first-level interconnects. As discussed above with reference to the conductive signal pathways 110 and the conductive reference pathways 136, the package substrate 124 may include additional conductive pathways (not shown) to conductively couple the conductive contacts 128 to the conductive contacts 130. The conductive contacts 128 of the package substrate 124 may be metal pads, in some embodiments.

The conductive signal pathways 110 and the conductive reference pathways 136 may be oriented substantially perpendicularly to the plane of the package substrate 124. Although all of the conductive pathways illustrated in FIG. 1 are substantially "linear" between the bottom surface 106 and the associated step surface 104, conductive pathways need not be linear and may, for example, include lateral extents. In some embodiments, a conductive signal pathway 110 and/or a conductive reference pathway 136 may include one or more stacks of vias. Other conductive elements may be disposed between or around multiple different stacks of vias in a conductive pathway. For example, the conductive reference pathway 136 illustrated in FIG. 1 includes four vias and the conductive shield planes 114-1 and 114-2 between various ones of the vias (discussed in further detail below with reference to the conductive shield 112). The conductive signal pathway 110-1 illustrated in FIG. 1 includes seven vias and several patterned conductive portions disposed between various ones of the vias (e.g., as discussed below with reference to FIGS. 7-24). More generally, as used herein, a "conductive pathway" may include a pillar of conductive material (e.g., a metal, such as copper), a through-hole plated with a conductive material, a via filled with a conductive material, a vertical or planer trace, a wire, or any other conductive pathway along which electrical signals are to flow.

Figure 2:
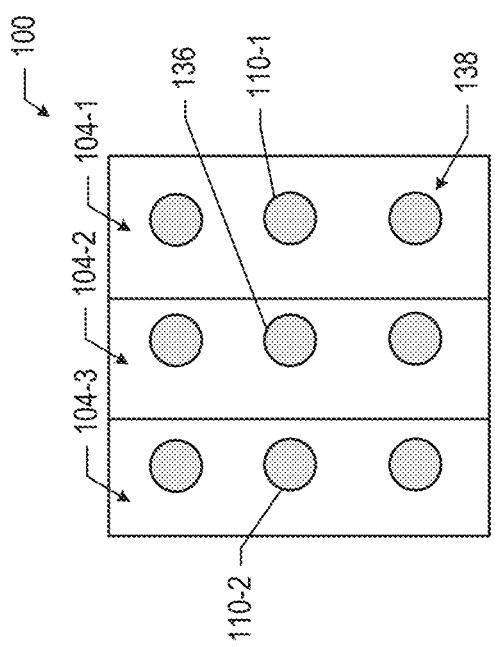
FIG. 2 is a top view of the stairstep interposer of FIG. 1, in accordance with various embodiments.

FIG. 2 is a top view of the stairstep interposer 102 of FIG. 1, in accordance with various embodiments, illustrating the step surfaces 104-1, 104-2, and 104-3, the conductive reference pathway 136, and the conductive signal pathways 110-1 and 110-2. Each step surface 104 may have additional conductive pathways extending to the bottom surface 106; FIG. 2 illustrates several example pathways 138 (with only one example labeled in the figure) exposed at each of the step surfaces 104. These pathways 138 may be conductive signal pathways 110 or conductive reference pathways 136, as desired. The interposers 102 disclosed herein may further include other conductive traces and structures to route electrical signals in and out of the interposer 102; these are not shown for ease of illustration.

Returning to FIG. 1, in some embodiments, the dies 120 included in the electronics package 100 may be "staggered" with respect to each other due to their positioning around the interposer 102. Different ones of the dies 120 may have different dimensions, and any number of dies 120 may be arranged in any desired manner in accordance with the present disclosure. In some embodiments, a die attach material 122 or other material may be disposed between adjacent ones of the dies 120 to mechanically secure the dies 120. The die attach material 122 may be an adhesive film or a paste, for example. In some embodiments, the die attach material 122 may be disposed on the "top" die in a stack (e.g., the die 120-1 in the embodiment of FIG. 1).

In some embodiments, the dies 120 and the interposer 102 may be encapsulated by an encapsulant 134. In some embodiments, the encapsulant 134 may include an underfill material disposed around the solder 118 between the interposer 102 and the package substrate 124, and disposed around the solder 131 between the die 120-4 and the package substrate 124. In other embodiments, no underfill material may be included in the electronics package 100. In some embodiments, the encapsulant 134 may include an overmold material that may "surround" the dies 120 and the interposer 102. In some embodiments, an underfill material and an overmold material may be different materials. Example materials that may be used for the encapsulant 134 may include epoxy molding compounds, polyurethanes, benzocyclobutene (BCB), polyimide, polyamide, high-density polyethylene (HDPE), liquid crystal polymer (LCP), aramide, and polydimethylsiloxane (PDMS), for example.

As noted above, the stairstep interposer 102 may include an integrated conductive shield 112. The conductive shield 112 may be embedded within the insulating material 103, and may serve to electrically shield different ones of the conductive signal pathways 110 from each other to reduce interference during operation. The conductive shield 112 may include one or more different sub-structures to provide shielding in different directions, as discussed below.

In some embodiments, the conductive shield 112 may include one or more conductive shield planes 114. A conductive shield plane 114 may be oriented substantially parallel to the step surfaces 104 (which may themselves be substantially parallel to a surface of the package substrate 124 on which the interposer 102 is disposed). For example, in the embodiment illustrated in FIG. 1, the conductive shield 112 may include a conductive shield plane 114-1 and a conductive shield plane 114-2. The conductive shield planes 114 may be coupled to the conductive reference pathway 136 so that the voltage at the conductive shield planes 114 is the same as the voltage at the conductive reference pathway 136 (e.g., ground or a power supply voltage).

Figure 3:
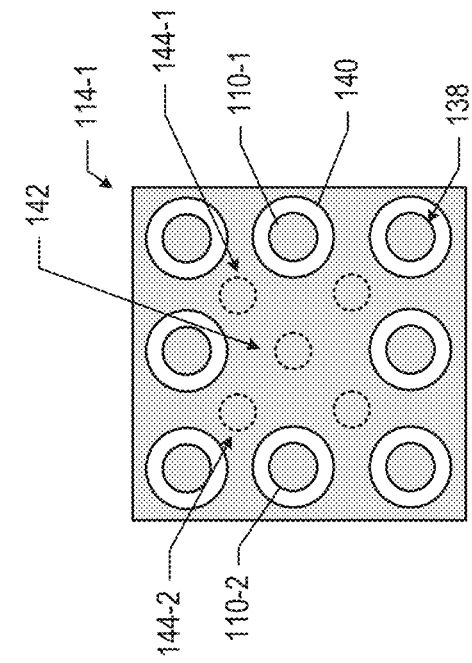
FIGS. 3 and 4 are top views of a conductive shield plane of the conductive shield of the stairstep interposer of FIG. 1, in accordance with different embodiments.
Figure 4:
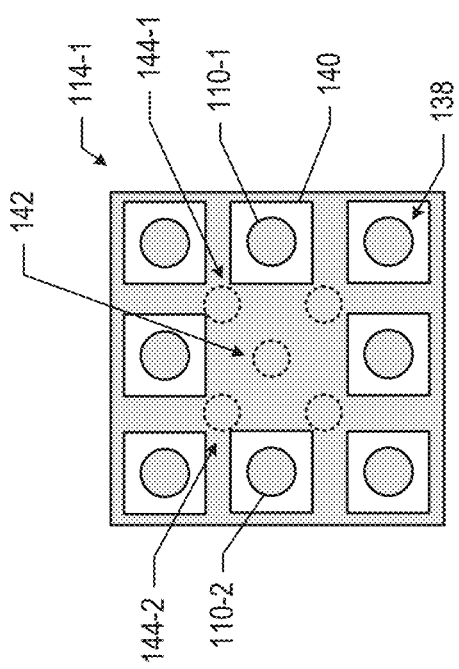

In some embodiments, a conductive shield plane 114 may include openings 140 through which one or more conductive signal pathways 110 may pass without contacting the conductive shield plane 114. For example, FIGS. 3 and 4 are top views of different example embodiments of the conductive shield plane 114-1 of the interposer 102 of FIG. 1. In FIG. 3, the conductive shield plane 114-1 includes multiple circular openings 140 whose edges are spaced away from the conductive signal pathways 110-1 and 110-2 (as well as from the conductive pathways 138). FIG. 3 also illustrates the footprint 142 of the conductive reference pathway 136 as it contacts the conductive shield plane 114-1 (e.g., at the base of a via, as illustrated in FIG. 1). In FIG. 4, the conductive shield plane 114-1 includes multiple rectangular openings 140 (e.g., square openings 140) whose edges are spaced away from the conductive signal pathways 110-1 and 110-2 (as well as from the conductive pathways 138). The conductive shield plane 114-1 illustrated in FIG. 4 may thus have a "grid" arrangement. As noted above with reference to FIG. 3, FIG. 4 also illustrates the footprint 142 of the conductive reference pathway 136 as it contacts the conductive shield plane 114-1. The openings 140 may have any shape, such as any polygon, lips, or other regular or irregular shape.

In some embodiments, the conductive shield 112 may include one or more conductive shield pathways 116. A conductive shield pathway 116 may be oriented perpendicular to a surface of the package substrate 124 on which the interposer 102 is disposed (and thus substantially parallel to the conductive signal pathways 110 and/or the conductive reference pathways 136, in some embodiments). For example, in the embodiment illustrated in FIG. 1, the conductive shield 112 may include a conductive shield pathway 116-1 and a conductive shield pathway 116-2. The conductive shield pathways 116 may be coupled to the conductive reference pathway 136 so that the voltage at the conductive shield pathways 116 is the same as the voltage at the conductive reference pathway 136 (e.g., ground or a power supply voltage). In some embodiments, a conductive shield pathway 116 may include one or more stacks of vias, as illustrated in FIG. 1, but the conductive shield pathway 116 may take any suitable form. As illustrated in FIG. 1, in some embodiments, the conductive shield pathways 116 may not extend to the bottom surface 106 and/or a step surface 104; in other embodiments, one or more conductive shield pathway 116 may extend to the bottom surface 106 or a step surface 104.

In some embodiments, the conductive shield pathways 116 may be coupled to the conductive reference pathway 136 by way of contact with a conductive shield plane 114 (as illustrated in FIG. 1). For example, FIGS. 3 and 4 illustrate the footprint 144-1 of the conductive shield pathway 116-1 as it contacts the conductive shield plane 114-1, and the footprint 144-2 of the conductive shield pathway 116-2 as it contacts the conductive shield plane 114-1 (e.g., at the bases of vias, as illustrated in FIG. 1). In other embodiments, the conductive shield pathways 116 may be coupled to the conductive reference pathway 136 without contacting a conductive shield plane 114. More particularly, in some embodiments, the conductive shield 112 may include one or more conductive shield pathways 116 without including any conductive shield planes 114. In other embodiments, the conductive shield 112 may include one or more conductive shield planes 114 without including any conductive shield pathways 116. In other embodiments (e.g., the embodiment illustrated in FIG. 1), the conductive shield 112 may include one or more conductive shield planes 114 and one or more conductive shield pathways 116.

In use, conductive shield planes 114 included in a conductive shield 112 may provide "horizontal" shielding (i.e., in a plane parallel to the plane of the package substrate 124, as discussed above), while conductive shield pathways 116 may provide "vertical" shielding (i.e., perpendicular to the plane of the package substrate 124). These conductive shield substructures may reduce unwanted energy coupling among the closely spaced conductive pathways within the interposer 102 by providing shorter signal return paths than would occur if the conductive shield 112 were not included. For example, as illustrated in FIGS. 1, 3, and 4, the distance between a conductive shield pathway 116 and a conductive signal pathway 110 may be less than the distance between the conductive reference pathway 136 and the conductive signal pathway 110; the presence of the conductive shield pathway 116 thus reduces the distance between the conductive signal pathway 110 and the reference voltage. Far-end crosstalk (FEXT) between conductive signal pathways, for example, is correlated with the rate of data transmission over the pathways and the distance between the pathways. Mitigation of such crosstalk using the interposers 102 may be particularly advantageous as the conductive pathways within the interposer 102 become closer, and/or as the speed of communication along these pathways increases. The conductive shield 112 may also generally mitigate unwanted electromagnetic interference (EMI) arising from within the electronics package 100 or from outside the electronics package 100.

Figure 5:
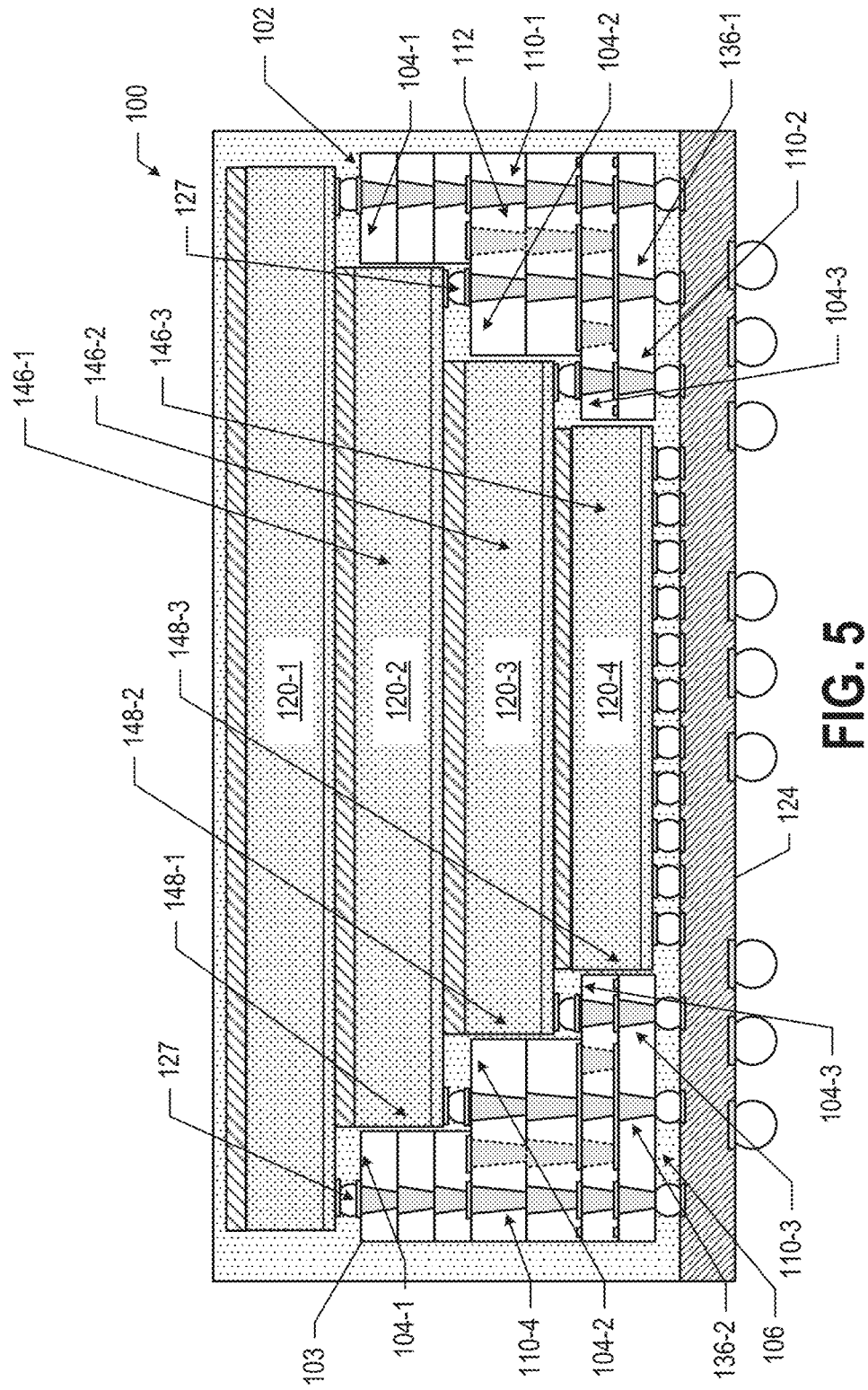
FIG. 5 is a side cross-sectional view of an electronics package including a stairstep interposer with an integrated conductive shield, in accordance with various embodiments.
Figure 7:
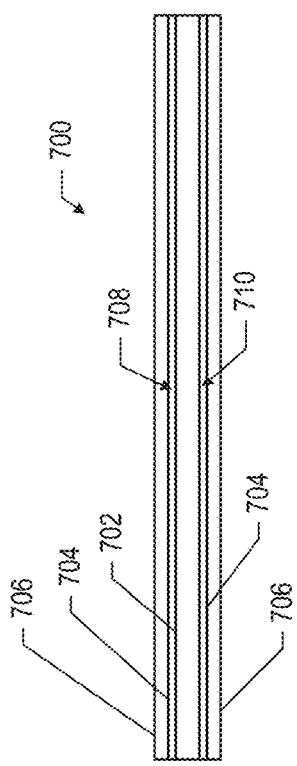

In some embodiments, the interposer 102 may be structured to "surround" the periphery of one or more dies 120 coupled thereto. For example, FIG. 5 is a side cross-sectional view of an electronics package 100 including a stairstep interposer 102 (with an integrated conductive shield 112) that forms multiple recesses, in accordance with various embodiments. As discussed above with reference to FIG. 1, the electronics package 100 of FIG. 5 may include an interposer 102 coupled to a package substrate 124. The interposer 102 may include an insulating material 103 having a stairstep structure with step surfaces 104-1, 104-2, and 104-3. FIG. 5 illustrates conductive signal pathways 110-1 and 110-4 extending from the step surface 104-1 to the bottom surface 106, and conductive signal pathways 110-2 and 110-3 extending from the step surface 104-3 to the bottom surface 106, FIG. 5 also illustrates conductive reference pathways 136-1 and 136-2 extending from the step surface 104-2 to the bottom surface 106. Some of the components of the electronics package 100 of FIG. 5 are not labeled for ease of illustration, and any suitable ones of the components of the electronics package 100 of FIG. 5 may take the form of any of the embodiments disclosed herein (e.g., with reference to FIG. 1).

Figure 6:
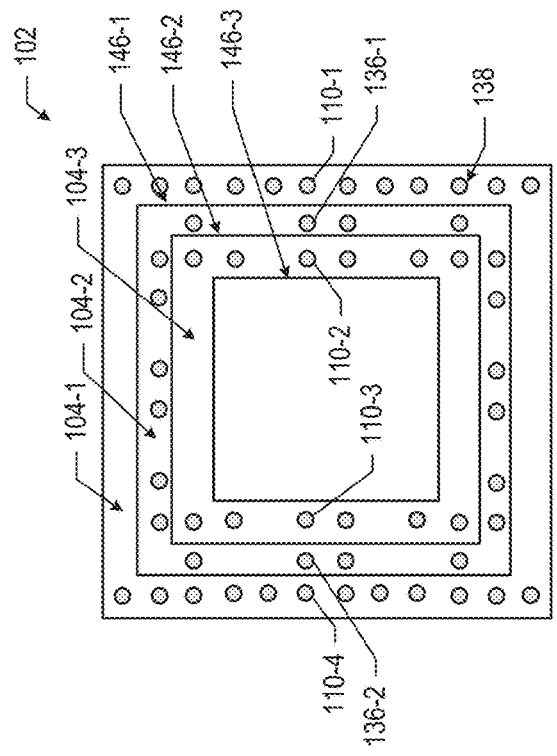
FIG. 6 is a top view of the stairstep interposer of FIG. 5, in accordance with various embodiments.

The interposer 102 of FIG. 5 may include inner sidewalls 148 that provide recesses in which a die 120 is disposed. For example, the inner sidewalls 148-1 of the interposer 102 may provide the periphery of a recess 146-1 in which the die 120-2 is disposed (as it is coupled to the conductive reference pathways 136-1 and 136-2 at the step surface 104-2). The inner sidewalls 148-2 of the interposer 102 may provide the periphery of a recess 146-2 in which the die 120-3 is disposed (as it is coupled to the conductive signal pathways 110-2 and 110-3 at the step surface 104-3). The inner sidewalls 148-3 of the interposer 102 may provide the periphery of a recess 146-3 and to which the die 120-4 is disposed (as it is coupled directly to the package substrate 124, as discussed above with reference to FIG. 1). The die 120-1 may be disposed on "top" of the interposer 102, as illustrated in FIG. 5 and as discussed above with reference to FIG. 1. FIG. 6 is a top view of the stairstep interposer 102 of FIG. 5, in accordance with various embodiments, illustrating the step surfaces 104, the conductive signal pathways 110, the conductive reference pathways 136, and the recesses 146. As discussed above with reference to the embodiment of FIGS. 1-4, the interposer 102 may include additional conductive pathways 138 to couple the dies 120 to the package substrate 124. Embodiments like that depicted in FIG. 5 may accommodate higher throughput bandwidth and interconnect density than a "one-sided" embodiment like FIG. 1 by providing more area on each step surface 104 for conductive contacts 127.

The interposers 102 depicted in FIGS. 1 and 5 may have footprints that are approximately the same as the footprints of the stack of dies 120 (e.g., a little smaller than or a little larger than). The interposers 102 may thus be used to achieve small form factor chip scale packaging (CSP) structures.

The interposers 102 disclosed herein may be manufactured using any suitable technique. FIGS. 7-24 are side cross-sectional views of various assemblies during an example process for manufacturing the stairstep interposer 102 of FIG. 1, in accordance with various embodiments. In the process illustrated in FIGS. 7-24, interposers 102 may be assembled in panel or strip form, which may enable the interposers 102 to be tested prior to assembling the interposers 102 into an electronics package 100. Although FIGS. 7-24 illustrate the manufacture of the stairstep interposer 102 of FIG. 1, the manufacturing operations discussed with reference to these figures is readily applicable to manufacture of other embodiments of the interposer 102, such as the embodiment illustrated in FIG. 5.

HG. 7 depicts an assembly 700 that includes a core 702 with a first face 708 and an opposing second face 710, first foil layers 704 disposed on the first face 708 and the second face 710 of the core 702, and second foil layers 706 disposed on the first foil layers 704. All of the manufacturing operations discussed with reference to FIGS. 7-24 may be performed symmetrically on both faces 708 and 710 of the core 702, and for ease of discussion, only the components on the first face 708 are labeled in FIGS. 7-24. In other embodiments, the interposer 102 may be manufactured via a single-sided process that does not include symmetric components on the opposite face of the core 702. The first foil layer 704 and the second foil layer 706 may be temporarily adhered to each other for separation later in the manufacturing process (as discussed below with reference to FIG. 24). In some embodiments, the first foil layer 704 and the second foil layer 706 may be copper foils, but other suitable materials (such as other metals) may be used. The first foil layer 704 and the second foil layer 706 may have any suitable relative dimensions. For example, the first foil layer 704 may be thinner than the second foil layer 706, and/or the first foil layer 704 may have a smaller area than the second foil layer 706 (e.g., to facilitate the panel separation process, as discussed below with reference to FIG. 24). In some embodiments, the two adjacent foil layers 704 and 706 may be replaced by a single foil layer in the assembly 700. The core 702 may be formed of any suitable material known in the art, such as bismaleimide triazine (BT) resin or fiberglass epoxy. The foil layers 704 and 706 may be attached to each other and to the core 702 using any suitable technique, such as lamination or a hot-press process. Lamination or hot-press processing may result in the first foil layer 704 and the second foil layer 706 being temporarily adhered together via a metal diffusion mechanism. In some embodiments, the first foil layer 704 may be at least partially embedded in the core 702.

Figure 8:
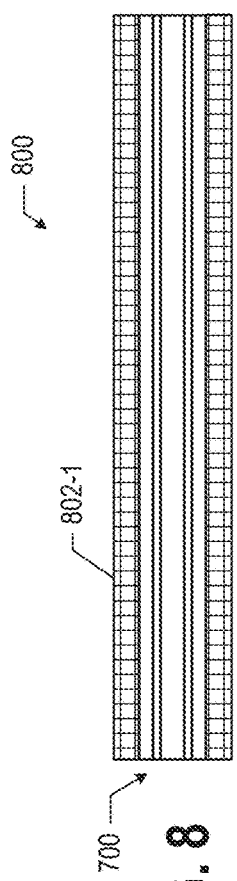

FIG. 8 depicts an assembly 800 subsequent to providing a layer of photoresist 802-1 on the second foil layer 706 of the assembly 700. The photoresist layer 802-1 may be provided using any suitable technique, such as spin coating or spray coating. In some embodiments, the photoresist layer 802-1 may be a dry film resist (DFR) that is laminated onto the assembly 700.

Figure 9:
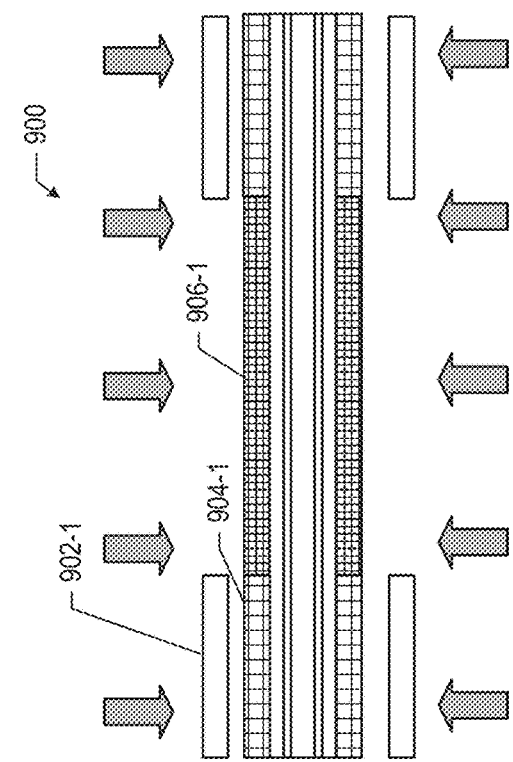

FIG. 9 depicts an assembly 900 subsequent to developing the photoresist layer 802-1 of the assembly 800 using a mask 902-1 and an electromagnetic radiation source (illustrated by the arrows to create unexposed regions 904-1 and exposed regions 906-1 of the photoresist layer 802-1. In some embodiments, the electromagnetic radiation used to develop the photoresist layer 802-1 may be ultraviolet light, but the type of radiation will depend on the material used in the photoresist layer 802-1, as known in the art. The mask 902-1 may be any suitable mask, such as a glass mask, and may be patterned to create a desired corresponding pattern in the photoresist layer 802-1, as known in the art.

Figure 10:
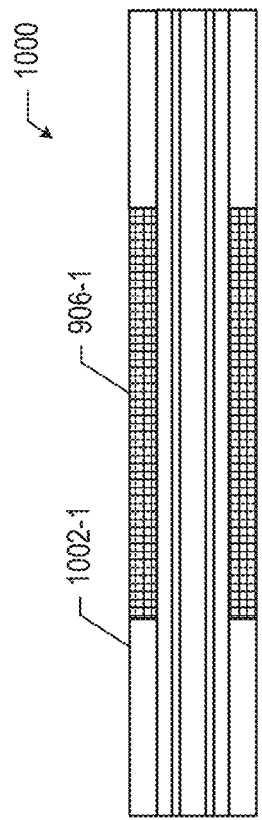

FIG. 10 depicts an assembly 1000 subsequent to etching away the unexposed regions 904-1 in the assembly 900 and providing an insulating material 1002-1 (e.g., a dielectric material) in their place. These operations may be performed in accordance with any suitable dielectric build-up process, as known in the art. For example, etching the unexposed regions 904-1 may leave recesses in their plate; the insulating material 1002-1 may then be laminated over these recesses and the remaining exposed regions 906-1, then a grinding process may remove the insulating material 1002-1 disposed over the exposed regions 906-1, resulting in the assembly 1000.

Figure 11:
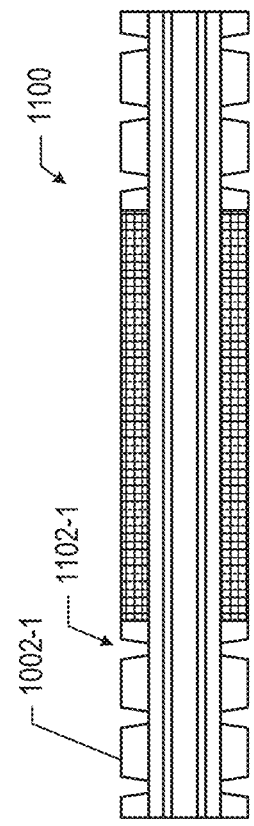

FIG. 11 depicts an assembly 1100 subsequent to forming via openings 1102-1 in the insulating material 1002-1 of the assembly 1000. The via openings 1102-1 may be formed using any suitable technique, such as laser drilling. In some embodiments, the via openings 1102 disclosed herein (as well as the vias formed in the openings, such as the vias 1202 discussed below) may have a diameter between 10 and 30 microns. When the via openings 1102 are tapered, this diameter may be measured at the wider end of the via opening 1102.

Figure 12:
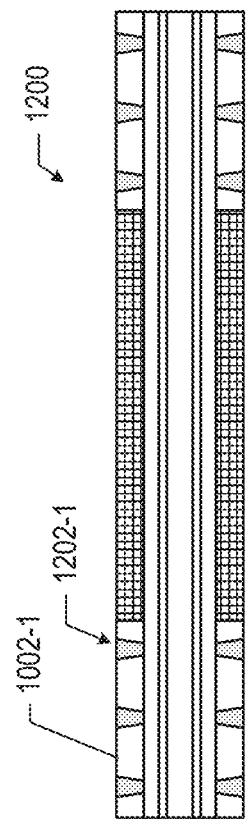

FIG. 12 depicts an assembly 1200 subsequent to filling the via openings 1102-1 of the assembly 1100 to form the vias 1202-1. The vias 1202-1 may be formed of a conductive material, such as copper (as discussed above with reference to the conductive signal pathways 110 and the conductive reference pathways 136). In some embodiments, the via openings 1102-1 may be filled to form the vias 1202-1 by an electroless and/or an electrolytic plating process, as known in the art.

Figure 13:
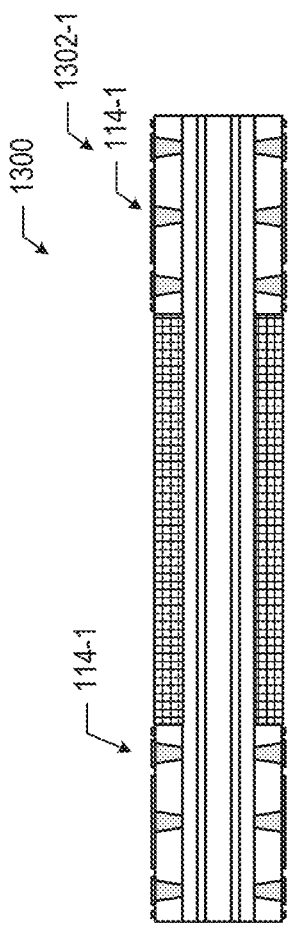

FIG. 13 depicts an assembly 1300 subsequent to providing a patterned conductive material 1302 to the assembly 1200. The patterned conductive material 1302 may include the conductive shield plane 114-1, which may take the form of any of the embodiments of the conductive shield plane 114-1 disclosed herein (e.g., with reference to FIGS. 1-3). In some embodiments, a semi-additive patterning process may be used to provide the patterned conductive material 1302.

Providing the patterned conductive material 1302 may include, for example, providing a thin electroless layer over the exposed regions 906-1, insulating material 1002-1 and the vias 1202-1, providing a layer of photoresist (e.g., laminating a layer of DFR over the thin electroless layer), developing the photoresist (e.g., as discussed above with reference to FIG. 9), stripping the unexposed photoresist to yield the pattern for the patterned conductive material 1302, providing the patterned conductive material 1302 (e.g., by electrolytic plating), and "flash" etching the thin electroless layer, as known in the art.

FIG. 14 depicts an assembly 1400 subsequent to providing a layer of photoresist 802-2 on the assembly 1300. The photoresist layer 802-2 may take the form of any of the embodiments of the photoresist layer 802-1 discussed above with reference to FIG. 8. For example, the photoresist layer 802-2 may be a dry film resist (DFR) that is laminated onto the assembly 1300.

FIG. 15 depicts an assembly 1500 subsequent to developing the photoresist layer 802-2 of the assembly 1400 using a mask 902-2 and an electromagnetic radiation source (illustrated by the arrows) to create unexposed regions 904-2 and exposed regions 906-2 of the photoresist layer 802-2. These operations may take the form of any of the embodiments discussed above with reference to FIG. 9.

FIG. 16 depicts an assembly 1600 subsequent to etching away the unexposed regions 904-2 in the assembly 1500 and providing an insulating material 1002-2 (e.g., a dielectric material) in their place. These operations may be performed in accordance with any of the embodiments discussed above with reference to FIG. 10.

Figure 17:
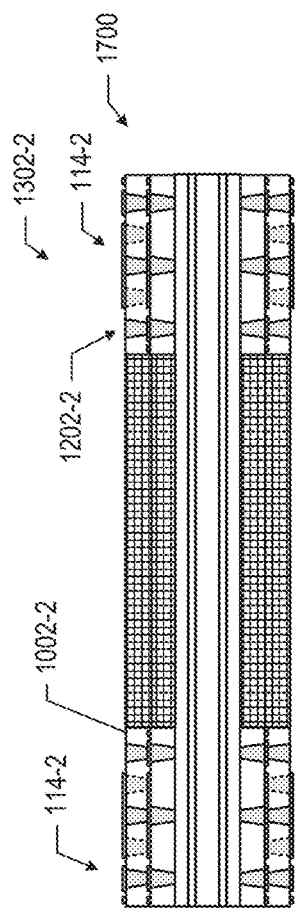

FIG. 17 depicts an assembly 1700 subsequent to forming via openings in the insulating material 1002-2 of the assembly 1600, filling the via openings to form vias 1202-2, and providing a patterned conductive material 1302-2 to the assembly 1600. These operations may be performed in accordance with any of the embodiments of FIGS. 11-13 discussed above. The patterned conductive material 1302 may include the conductive shield plane 114-2, which may take the form of any of the embodiments of the conductive shield plane 114-2 disclosed herein (e.g., with reference to FIGS. 1-3).

Figure 18:
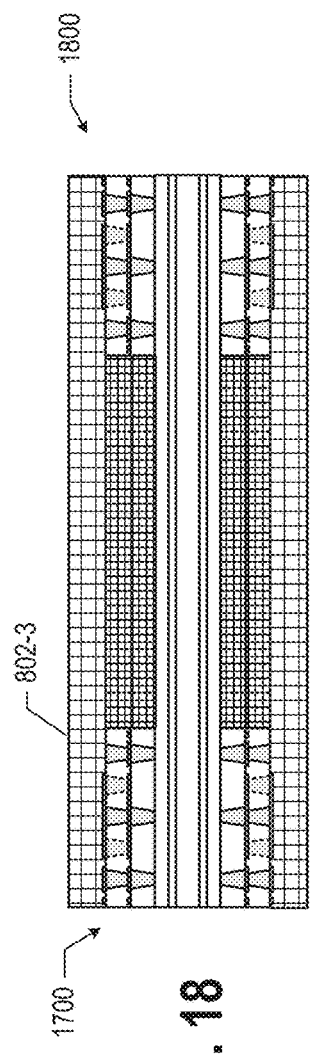

FIG. 18 depicts an assembly 1800 subsequent to providing a layer of photoresist 802-3 on the assembly 1700. The photoresist layer 802-3 may take the form of any of the embodiments of the photoresist layer 802-1 discussed above with reference to FIG. 8. For example, the photoresist layer 802-3 may be a dry film resist (DFR) that is laminated onto the assembly 1700.

Figure 19:
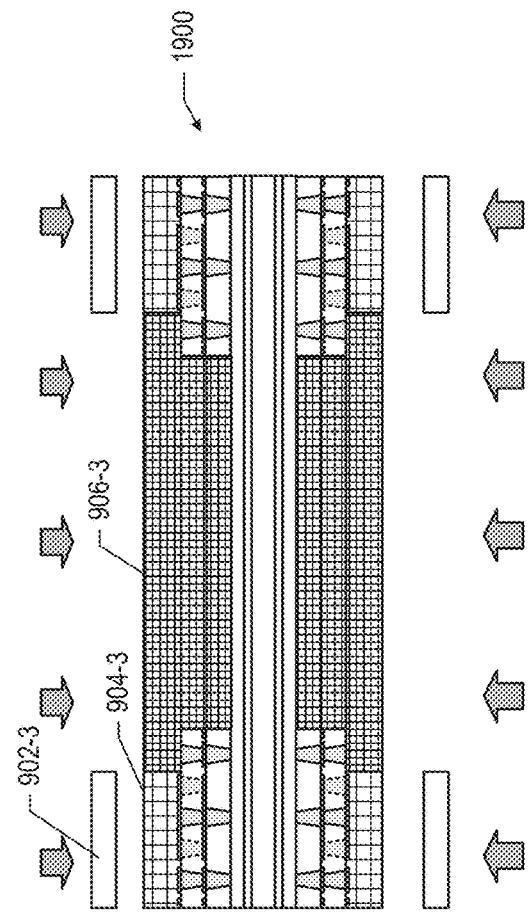

FIG. 19 depicts an assembly 1900 subsequent to developing the photoresist layer 802-3 of the assembly 1800 using a mask 902-3 and an electromagnetic radiation source (illustrated by the arrows) to create unexposed regions 904-3 and exposed regions 906-3 of the photoresist layer 802-3. These operations may take the form of any of the embodiments discussed above with reference to FIG. 9. The geometry of the mask 902-3 may result in an unexposed region 904-3 that is "narrower" than the insulating material 1002-2 below it, exposing the step surface 104-3.

FIG. 20 depicts an assembly 2000 subsequent to etching away the unexposed regions 904-3 in the assembly 1900 and providing an insulating material 1002-3 (e.g., a dielectric material) in their place. These operations may be performed in accordance with any of the embodiments discussed above with reference to FIG. 10.

FIG. 21 depicts an assembly 2100 subsequent to forming via openings in the insulating material 1002-3 of the assembly 2000, and filling the via openings to form vias 1202-3. These operations may be performed in accordance with any of the embodiments of FIGS. 11-13 discussed above.

FIG. 22 depicts an assembly 2200 subsequent to forming additional layers 2202 on the assembly 2100 in accordance with the techniques discussed above with reference to FIGS. 8-21. Each of the layers 2202 may include insulating material 1002 and exposed regions 906. The insulating material 1002 and the structures disposed therein may form four of the interposers 102 of FIG. 1.

FIG. 23 depicts an assembly 2300 subsequent to removing the exposed region 906 from the assembly 2200, and surface-finishing the step surfaces 104 to form the conductive contacts 127. The exposed region 906 may be removed by chemical etching, for example, with a particular etch chemistry dictated by the material of the exposed region 906, as known in the art. The conductive contacts 127 may be formed by, for example, electrolytic gold plating.

FIG. 24 depicts an assembly 2400 subsequent to panel separation and singulation to separate the four interposers 102 from each other. In some embodiments, the core 702 and the first foil layer 704 may be separated from the interposer 102 and the second foil layer 706 through mechanical peeling or an ultrasonic vibration process (after the panel edges are cut). The second foil layer 706 may then be etched away from the interposer 102 through a chemical etching process.

In some embodiments, after the interposers 102 have been manufactured, multiple electronics packages 100 may be assembled in strip form (e.g., with the dies 120 coupled to the interposer 102) and molded with the encapsulant 134 after a thermal reflow process to couple the interposer 102 to the package substrate 124. After molding, back-end processes may be performed (e.g., attaching of the solder 132 and the singulation of the electronics packages 100 from each other). This example assembly process is simply illustrative, and the various operations may be performed in other orders.

As noted above, the interposers disclosed herein may be manufactured using any suitable techniques. FIG. 25 is a flow diagram of a method 2500 of manufacturing a stairstep interposer with integrated shielding, in accordance with various embodiments. Although the operations of the method 2500 may be illustrated with reference to various embodiments of the interposers 102 disclosed herein, any suitable interposer may be manufactured in accordance with the method 2500.

At 2502, a multilayer assembly may be formed on a base material. Each layer of the multilayer assembly may include a dielectric region and a corresponding sacrificial region. The dielectric regions may form an insulating material having a stairstep structure, and at least one conductive signal pathway may extend from a step surface of the insulating material to a bottom surface of the insulating material. The multilayer assembly may include a conductive shield disposed within the insulating material to shield the conductive signal pathway. For example, the assembly 2200 (FIG. 22) may include multiple layers of insulating dielectric material 1002 and sacrificial exposed photoresist regions 906, formed on the assembly 2200. The assembly 2200 may include four sets of insulating material 103, each having a stairstep structure. Conductive signal pathways 110-1 and 110-2 may extend from different step surfaces 104 of the insulating material 103 to a bottom surface 106 of the insulating material 103, and a conductive shield 112 may be disposed within the insulating material 103 (e.g., as discussed above with reference to FIG. 1).

At 2504, the sacrificial regions may be removed. For example, as discussed above with reference to FIG. 23, the exposed region 906 may be etched away from the assembly 2200.

At 2506, the base material may be removed. For example, as discussed above with reference to FIG. 24, the assembly 700 may be removed from the assembly 2300, yielding multiple interposers 102.

The stairstep interposers 102 disclosed herein may be included in any suitable electronic device. FIGS. 26-29 illustrate various examples of apparatuses that may be included in, or that may include, an electronics package 100 including one or more of any of the stairstep interposers 102 disclosed herein.

FIGS. 26A-B are top views of a wafer 2600 and dies 2602 that may be included in an electronics package 100 (e.g., in a die 120) in accordance with any of the embodiments disclosed herein. The wafer 2600 may be composed of semiconductor material and may include one or more dies 2602 having IC structures formed on a surface of the wafer 2600. Each of the dies 2602 (which may be used as a die 120 in an electronics package 100) may be a repeating unit of a semiconductor product that includes any suitable IC. After the fabrication of the semiconductor product is complete, the wafer 2600 may undergo a singulation process in which each of the dies 2602 is separated from one another to provide discrete "chips" of the semiconductor product. The die 2602 may include one or more transistors (e.g., some of the transistors 2740 of FIG. 27, discussed below) and/or supporting circuitry to route electrical signals to the transistors, as well as any other IC components. In some embodiments, the wafer 2600 or the die 2602 may include a memory device (e.g., a static random access memory (SRAM) device), a logic device (e.g., an AND, OR, NAND, or NOR gate), or any other suitable circuit element. Multiple ones of these devices may be combined on a single die 2602. For example, a memory array formed by multiple memory devices may be formed on a same die 2602 as a processing device (e.g., the processing device 2902 of FIG. 29) or other logic that is configured to store information in the memory devices or execute instructions stored in the memory array.

FIG. 27 is a cross-sectional side view of an IC device 2700 that may be included in an electronics package 100 having a stairstep interposer 102 in accordance with any of the embodiments disclosed herein. In particular, one or more of the IC devices 2700 may be included in one or more dies 120. The IC device 2700 may be formed on a substrate 2702 (e.g., the wafer 2600 of FIG. 26A) and may be included in a die (e.g., the die 2602 of FIG. 26B). The substrate 2702 may be a semiconductor substrate composed of semiconductor material systems including, for example, N-type or P-type materials systems. The substrate 2702 may include, for example, a crystalline substrate formed using a bulk silicon or a silicon-on-insulator substructure. In some embodiments, the semiconductor substrate 2702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2702. Although a few examples of materials from which the substrate 2702 may be formed are described here, any material that may serve as a foundation for an IC device 2700 may be used. The substrate 2702 may be part of a singulated die (e.g., the dies 2602 of FIG. 26B) or a wafer (e.g., the wafer 2600 of FIG. 26A).

The IC device 2700 may include one or more device layers 2704 disposed on the substrate 2702. The device layer 2704 may include features of one or more transistors 2740 (e.g., metal oxide semiconductor field-effect transistors (MOSFETs)) formed on the substrate 2702. The device layer 2704 may include, for example, one or more source and/or drain (S/D) regions 2720, a gate 2722 to control current flow in the transistors 2740 between the S/D regions 2720, and one or more S/D contacts 2724 to route electrical signals to/from the S/D regions 2720. The transistors 2740 may include additional features not depicted for the sake of clarity, such as device isolation regions, gate contacts, and the like. The transistors 2740 are not limited to the type and configuration depicted in FIG. 27 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2740 may include a gate 2722 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work function metal or N-type work function metal, depending on whether the transistor 2740 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross-section of the transistor 2740 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2720 may be formed within the substrate 2702 adjacent to the gate 2722 of each transistor 2740. The S/D regions 2720 may be formed using either an implantation/diffusion process or an etching/deposition process, for example. In the former process, dopants such as boron, aluminum, antimony, phosphorous, or arsenic may be ion-implanted into the substrate 2702 to form the S/D regions 2720. An annealing process that activates the dopants and causes them to diffuse farther into the substrate 2702 may follow the ion-implantation process. In the latter process, the substrate 2702 may first be etched to form recesses at the locations of the S/D regions 2720. An epitaxial deposition process may then be carried out to fill the recesses with material that is used to fabricate the S/D regions 2720. In some implementations, the S/D regions 2720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2720 may be formed using one or more alternate semiconductor materials such as germanium or a group III-V material or alloy. In further embodiments, one or more layers of metal and/or metal alloys may be used to form the S/D regions 2720.

Electrical signals, such as power and/or input/output (I/O) signals, may be routed to and/or from the transistors 2740 of the device layer 2704 through one or more interconnect layers disposed on the device layer 2704 (illustrated in FIG. 27 as interconnect layers 2706-2710). For example, electrically conductive features of the device layer 2704 (e.g., the gate 2722 and the S/D contacts 2724) may be electrically coupled with the interconnect structures 2728 of the interconnect layers 2706-2710. The one or more interconnect layers 2706-2710 may form an interlayer dielectric (ILD) stack 2719 of the IC device 2700.

The interconnect structures 2728 may be arranged within the interconnect layers 2706-2710 to route electrical signals according to a wide variety of designs (in particular, the arrangement is not limited to the particular configuration of interconnect structures 2728 depicted in FIG. 27). Although a particular number of interconnect layers 2706-2710 is depicted in FIG. 27, embodiments of the present disclosure include IC devices having more or fewer interconnect layers than depicted.

In some embodiments, the interconnect structures 2728 may include trench structures 2728a (sometimes referred to as "lines") and/or via structures 2728b (sometimes referred to as "holes") filled with an electrically conductive material such as a metal. The trench structures 2728a may be arranged to route electrical signals in a direction of a plane that is substantially parallel with a surface of the substrate 2702 upon which the device layer 2704 is formed. For example, the trench structures 2728a may route electrical signals in a direction in and out of the page from the perspective of FIG. 27. The via structures 2728b may be arranged to route electrical signals in a direction of a plane that is substantially perpendicular to the surface of the substrate 2702 upon which the device layer 2704 is formed. In some embodiments, the via structures 2728b may electrically couple trench structures 2728a of different interconnect layers 2706-2710 together.

The interconnect layers 2706-2710 may include a dielectric material 2726 disposed between the interconnect structures 2728, as shown in FIG. 27. In some embodiments, the dielectric material 2726 disposed between the interconnect structures 2728 in different ones of the interconnect layers 2706-2710 may have different compositions; in other embodiments, the composition of the dielectric material 2726 between different interconnect layers 2706-2710 may be the same.

A first interconnect layer 2706 (referred to as Metal 1 or "M1") may be formed directly on the device layer 2704. In some embodiments, the first interconnect layer 2706 may include trench structures 2728a and/or via structures 2728b, as shown. The trench structures 2728a of the first interconnect layer 2706 may be coupled with contacts (e.g., the S/D contacts 2724) of the device layer 2704.

A second interconnect layer 2708 (referred to as Metal 2 or "M2") may be formed directly on the first interconnect layer 2706. In some embodiments, the second interconnect layer 2708 may include via structures 2728b to couple the trench structures 2728a of the second interconnect layer 2708 with the trench structures 2728a of the first interconnect layer 2706. Although the trench structures 2728a and the via structures 2728b are structurally delineated with a line within each interconnect layer (e.g., within the second interconnect layer 2708) for the sake of clarity, the trench structures 2728a and the via structures 2728b may be structurally and/or materially contiguous (e.g., simultaneously filled during a dual-damascene process) in some embodiments.

A third interconnect layer 2710 (referred to as Metal 3 or "M3") (and additional interconnect layers, as desired) may be formed in succession on the second interconnect layer 2708 according to similar techniques and configurations described in connection with the second interconnect layer 2708 or the first interconnect layer 2706.

The IC device 2700 may include a solder resist material 2734 (e.g., polyimide or similar material) and one or more bond pads 2736 formed on the interconnect layers 2706-2710. The bond pads 2736 may provide the conductive contacts 123 of the dies 120 in FIGS. 1 and 5, for example. The bond pads 2736 may be electrically coupled with the interconnect structures 2728 and configured to route the electrical signals of the transistor(s) 2740 to other external devices. For example, solder bonds may be formed on the one or more bond pads 2736 to mechanically and/or electrically couple a chip including the IC device 2700 with another component (e.g., a circuit board). The IC device 2700 may have other alternative configurations to route the electrical signals from the interconnect layers 2706-2710 than depicted in other embodiments. For example, the bond pads 2736 may be replaced by or may further include other analogous features (e.g., posts) that route the electrical signals to external components.

Figure 28:
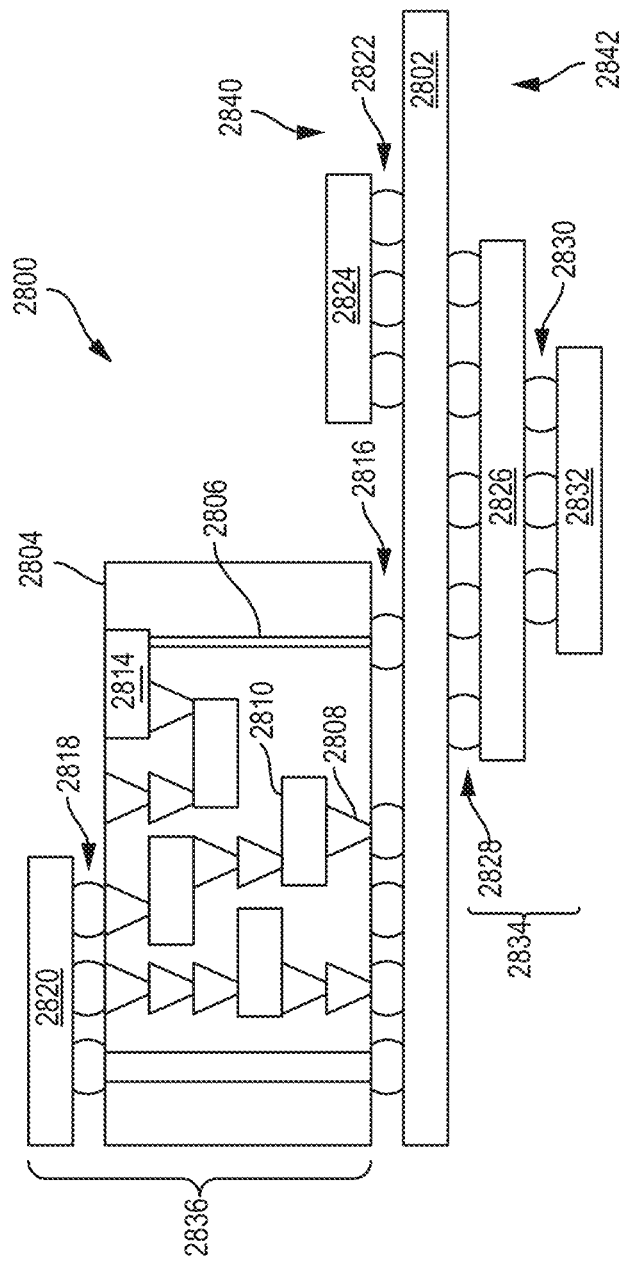
FIG. 28 is a cross-sectional side view of an IC device assembly that may be included in an electronics package having a stairstep interposer in accordance with any of the embodiments disclosed herein.

FIG. 28 is a cross-sectional side view of an IC device assembly 2800 that may include an electronics package 100 including a stairstep interposer 102 in accordance with any of the embodiments disclosed herein. The IC device assembly 2800 includes a number of components disposed on a circuit board 2802 (which may be, e.g., a motherboard). The IC device assembly 2800 includes components disposed on a first face 2840 of the circuit board 2802 and an opposing second face 2842 of the circuit board 2802; generally, components may be disposed on one or both faces 2840 and 2842.

In some embodiments, the circuit board 2802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2802. In other embodiments, the circuit board 2802 may be a non-PCB substrate.

The IC device assembly 2800 illustrated in FIG. 28 includes a package-on-interposer structure 2836 coupled to the first face 2840 of the circuit board 2802 by coupling components 2816. The coupling components 2816 may electrically and mechanically couple the package-on-interposer structure 2836 to the circuit board 2802, and may include solder balls (as shown in FIG. 28), male and female portions of a socket, an adhesive, an underfill material, and/or any other suitable electrical and/or mechanical coupling structure.

The package-on-interposer structure 2836 may include an electronics package 2820 coupled to an interposer 2804 by coupling components 2818. The coupling components 2818 may take any suitable form for the application, such as the forms discussed above with reference to the coupling components 2816. Although a single electronics package 2820 is shown in FIG. 28, multiple electronics packages may be coupled to the interposer 2804; indeed, additional interposers may be coupled to the interposer 2804. The interposer 2804 may provide an intervening substrate used to bridge the circuit board 2802 and the electronics package 2820. The electronics package 2820 may be or include, for example, a die (the die 2602 of FIG. 26B), an IC device (e.g., the IC device 2700 of FIG. 27), or any other suitable component. Generally, the interposer 2804 may spread a connection to a wider pitch or reroute a connection to a different connection. For example, the interposer 2804 may couple the electronics package 2820 (e.g., a die) to a ball grid array (BGA) of the coupling components 2816 for coupling to the circuit board 2802. In the embodiment illustrated in FIG. 28, the electronics package 2820 and the circuit board 2802 are attached to opposing sides of the interposer 2804; in other embodiments, the electronics package 2820 and the circuit board 2802 may be attached to a same side of the interposer 2804. In some embodiments, three or more components may be interconnected by way of the interposer 2804. In some embodiments, the electronics package 2820 may take the form of any of the electronics packages 100 disclosed herein.

The interposer 2804 may be formed of an epoxy resin, a fiberglass-reinforced epoxy resin, a ceramic material, or a polymer material such as polyimide. In some embodiments, the interposer 2804 may be formed of alternate rigid or flexible materials that may include the same materials described above for use in a semiconductor substrate, such as silicon, germanium, and other group III-V and group IV materials. The interposer 2804 may include metal interconnects 2808 and vias 2810, including but not limited to through-silicon vias (TSVs) 2806. The interposer 2804 may further include embedded devices 2814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2804. The package-on-interposer structure 2836 may take the form of any of the package-on-interposer structures known in the art.

The IC device assembly 2800 may include an electronics package 2824 coupled to the first face 2840 of the circuit board 2802 by coupling components 2822. The coupling components 2822 may take the form of any of the embodiments discussed above with reference to the coupling components 2816, and the electronics package 2824 may take the form of any of the embodiments discussed above with reference to the electronics package 2820. In some embodiments, the electronics package 2824 may take the form of any of the electronics packages 100 disclosed herein.

The IC device assembly 2800 illustrated in FIG. 28 includes a package-on-package structure 2834 coupled to the second face 2842 of the circuit board 2802 by coupling components 2828. The package-on-package structure 2834 may include an electronics package 2826 and an electronics package 2832 coupled together by coupling components 2830 such that the electronics package 2826 is disposed between the circuit board 2802 and the electronics package 2832. The coupling components 2828 and 2830 may take the form of any of the embodiments of the coupling components 2816 discussed above, and the electronics packages 2826 and 2832 may take the form of any of the embodiments of the electronics package 2820 discussed above. The package-on-package structure 2834 may be configured in accordance with any of the package-on-package structures known in the art. In some embodiments, the electronics package 2826 and/or the electronics package 2832 may take the form of any of the electronics packages 100 disclosed herein.

Figure 29:
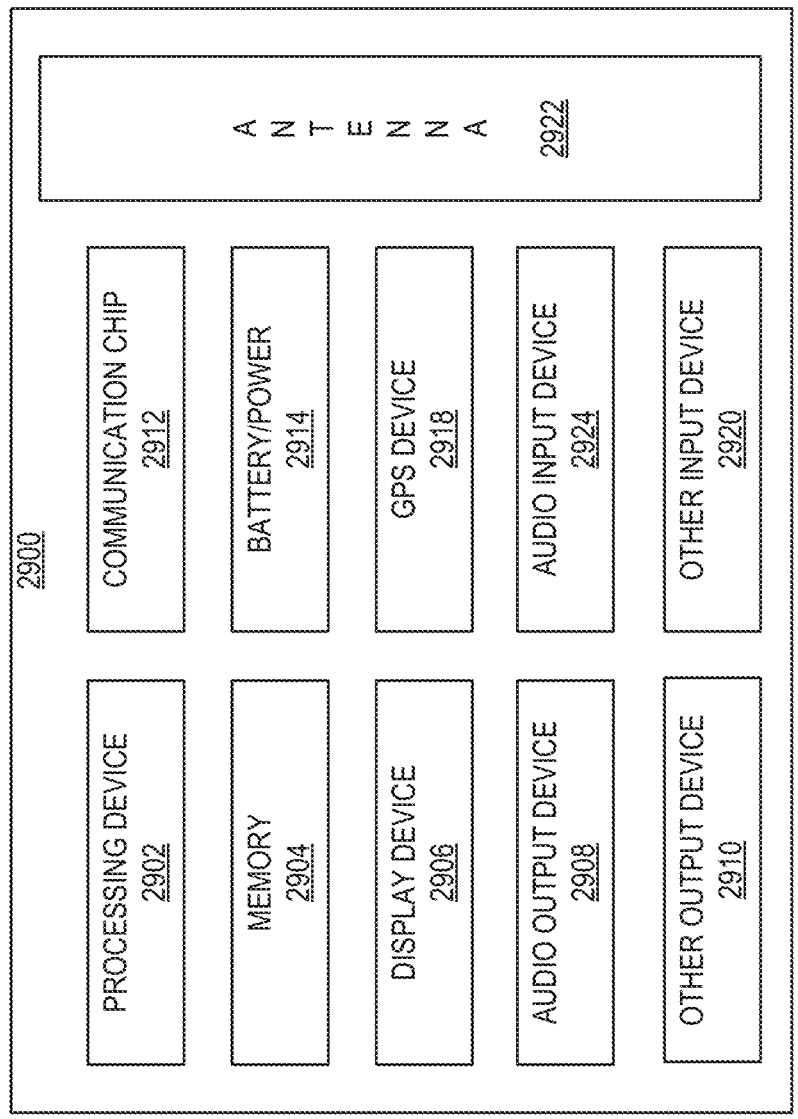
FIG. 29 is a block diagram of an example computing device that includes one or more electronics packages including one or more stairstep interposers in accordance with any of the embodiments disclosed herein.

FIG. 29 is a block diagram of an example computing device 2900 that may include one or more electronics packages 100 in accordance with any of the embodiments disclosed herein. For example, any suitable ones of the components of the computing device 2900 may include one or more of the electronics packages 100 disclosed herein. A number of components are illustrated in FIG. 29 as included in the computing device 2900, but any one or more of these components may be omitted or duplicated, as suitable for the application. In some embodiments, some or all of the components included in the computing device 2900 may be attached to one or more motherboards. In some embodiments, some or all of these components are fabricated onto a single system-on-a-chip (SoC) die.

Additionally, in various embodiments, the computing device 2900 may not include one or more of the components illustrated in FIG. 29, but the computing device 2900 may include interface circuitry for coupling to the one or more components. For example, the computing device 2900 may not include a display device 2906, but may include display device interface circuitry (e.g., a connector and driver circuitry) to which a display device 2906 may be coupled. In another set of examples, the computing device 2900 may not include an audio input device 2924 or an audio output device 2908, but may include audio input or output device interface circuitry (e.g., connectors and supporting circuitry) to which an audio input device 2924 or audio output device 2908 may be coupled.

The computing device 2900 may include a processing device 2902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2900 may include a memory 2904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2904 may include memory that shares a die with the processing device 2902. This memory may be used as cache memory and may include embedded dynamic random access memory (eDRAM) or spin transfer torque magnetic random-access memory (STT-MRAM).

In some embodiments, the computing device 2900 may include a communication chip 2912 (e.g., one or more communication chips). For example, the communication chip 2912 may be configured for managing wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2912 may implement any of a number of wireless standards or protocols, including but not limited to Institute for Electrical and Electronic Engineers (IEEE) standards including Wi-Fi (IEEE 2702.11 family), IEEE 2702.16 standards (e.g., IEEE 2702.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 2702.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 2702.16 standards. The communication chip 2912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2912 may operate in accordance with other wireless protocols in other embodiments. The computing device 2900 may include an antenna 2922 to facilitate wireless communications and/or to receive other wireless communications (such as AM or FM radio transmissions).

In some embodiments, the communication chip 2912 may manage wired communications, such as electrical, optical, or any other suitable communication protocols (e.g., the Ethernet). As noted above, the communication chip 2912 may include multiple communication chips. For instance, a first communication chip 2912 may be dedicated to shorter-range wireless communications such as Wi-Fi or Bluetooth, and a second communication chip 2912 may be dedicated to longer-range wireless communications such as GPS, EDGE, GPRS, CDMA, WiMAX, LTE, EV-DO, or others. In some embodiments, a first communication chip 2912 may be dedicated to wireless communications, and a second communication chip 2912 may be dedicated to wired communications.

The computing device 2900 may include battery/power circuitry 2914. The battery/power circuitry 2914 may include one or more energy storage devices (e.g., batteries or capacitors) and/or circuitry for coupling components of the computing device 2900 to an energy source separate from the computing device 2900 (e.g., AC line power).

The computing device 2900 may include a display device 2906 (or corresponding interface circuitry, as discussed above). The display device 2906 may include any visual indicators, such as a heads-up display, a computer monitor, a projector, a touchscreen display, a liquid crystal display (LCD), a light-emitting diode display, or a flat panel display, for example.

The computing device 2900 may include an audio output device 2908 (or corresponding interface circuitry, as discussed above). The audio output device 2908 may include any device that generates an audible indicator, such as speakers, headsets, or earbuds, for example.

The computing device 2900 may include an audio input device 2924 (or corresponding interface circuitry, as discussed above). The audio input device 2924 may include any device that generates a signal representative of a sound, such as microphones, microphone arrays, or digital instruments (e.g., instruments having a musical instrument digital interface (MIDI) output).

The computing device 2900 may include a global positioning system (GPS) device 2918 (or corresponding interface circuitry, as discussed above). The GPS device 2918 may be in communication with a satellite-based system and may receive a location of the computing device 2900, as known in the art.

The computing device 2900 may include an other output device 2910 (or corresponding interface circuitry, as discussed above). Examples of the other output device 2910 may include an audio codec, a video codec, a printer, a wired or wireless transmitter for providing information to other devices, or an additional storage device.

The computing device 2900 may include an other input device 2920 (or corresponding interface circuitry, as discussed above). Examples of the other input device 2920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2900 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2900 may be any other electronic device that processes data.

The following paragraphs provide various examples of the embodiments disclosed herein.

Example 1 is an interposer, including: an insulating material having a stairstep structure with a first step surface, a second step surface, and a bottom surface to face a package substrate, wherein a first thickness of the insulating material between the first step surface and the bottom surface is greater than a second thickness of the insulating material between the second step surface and the bottom surface; a conductive signal pathway extending from the first step surface to the bottom surface; and a conductive shield disposed within the insulating material to shield the conductive signal pathway.

Example 2 may include the subject matter of Example 1, and may further specify that the conductive shield includes a conductive shield plane having an opening through which the conductive signal pathway passes without contacting the conductive shield plane.

Example 3 may include the subject matter of Example 2, and may further specify that the opening has a polygonal shape.

Example 4 may include the subject matter of any of Examples 2-3, and may further specify that the conductive signal pathway is a first conductive signal pathway, the opening is a first opening, the interposer further includes a second conductive signal pathway extending from the second step surface to the bottom surface, and the conductive shield plane has a second opening through which the second conductive signal pathway passes.

Example 5 may include the subject matter of any of Examples 2-4, and may further specify that the conductive signal pathway includes a first via disposed substantially to one side of the conductive shield plane and a second via disposed substantially on an opposing side of the conductive shield plane.

Example 6 may include the subject matter of Example 5, and may further specify that the conductive signal pathway includes a patterned conductive portion disposed within the opening between the first and second vias.

Example 7 may include the subject matter of any of Examples 1-6, and may further specify that the conductive shield is electrically coupled to a reference voltage.

Example 8 may include the subject matter of any of Examples 1-7, and may further specify that the conductive signal pathway is in electrical contact with a solder bump at the bottom surface to couple the interposer to the package substrate.

Example 9 may include the subject matter of any of Examples 1-8, and may further specify that the conductive signal pathway includes a stack of vias.

Example 10 may include the subject matter of any of Examples 1-9, and may further specify that the conductive signal pathway is a first conductive signal pathway, the interposer includes a second conductive signal pathway extending from the second step surface to the bottom surface, and the conductive shield is to shield the second conductive signal pathway.

Example 11 may include the subject matter of any of Examples 1-10, and may further specify that the conductive shield includes a conductive shield pathway oriented parallel to the conductive signal pathway and a conductive reference pathway.

Example 12 may include the subject matter of Example 11, and may further specify that the conductive shield pathway includes a stack of vias.

Example 13 may include the subject matter of any of Examples 11-12, and may further specify that the stairstep structure has a third step surface, a thickness of the insulating material between the first step surface and the second step surface is between the first and second thicknesses, and the conductive shield pathway extends between the third step surface and the bottom surface.

Example 14 may include the subject matter of any of Examples 11-13, and may further specify that the conductive shield pathway does not extend to the bottom surface.

Example 15 may include the subject matter of any of Examples 11-14, and may further specify that the conductive shield pathway is disposed between, but does not extend to, the first step surface and the bottom surface.

Example 16 may include the subject matter of any of Examples 11-15, and may further specify that the conductive shield pathway is closer to the conductive signal pathway than the conductive reference pathway is to the conductive signal pathway.

Example 17 is an electronics package, including: a first die; a second die; an interposer including an insulating material having a stairstep structure with a first step surface, a second step surface, and a bottom surface, wherein a first conductive signal pathway extends from the first step surface to the bottom surface, a second conductive signal pathway extends from the second step surface to the bottom surface, the first die is coupled to the first conductive signal pathway at the first step surface, and the second die is coupled to the second conductive signal pathway at the second step surface; and a package substrate coupled to the bottom surface of the interposer; wherein the interposer includes a conductive shield disposed within the insulating material to shield the first and second conductive signal pathways.

Example 18 may include the subject matter of Example 17, and may further specify that the first conductive signal pathway is in electrical contact with a solder bump at the bottom surface to couple to a first conductive contact on the package substrate, and the second conductive signal pathway is in electrical contact with a solder bump at the bottom surface to couple to a second conductive contact on the package substrate.

Example 19 may include the subject matter of any of Examples 17-18, and may further specify that the package substrate includes solder balls disposed opposite the interposer.

Example 20 may include the subject matter of any of Examples 17-19, and may further specify that the first and second dies are encased with an encapsulant.

Example 21 may include the subject matter of any of Examples 17-20, and may further specify that the first and second conductive signal pathways each include a stack of vias.

Example 22 may include the subject matter of any of Examples 17-21, and may further specify that the conductive shield includes a conductive shield plane having an opening through which the first conductive signal pathway passes without contacting the conductive shield plane.

Example 23 may include the subject matter of any of Examples 17-22, and may further specify that the conductive shield includes first and second conductive shield pathways oriented parallel to the first conductive signal pathway.

Example 24 may include the subject matter of any of Examples 17-23, and may further specify that the first die includes a processing device or a memory device.

Example 25 is a method of manufacturing an interposer, including: forming a multilayer assembly on a base material, each layer comprising a dielectric region and a corresponding sacrificial region, wherein the dielectric regions form an insulating material having a stairstep structure, at least one conductive signal pathway extends from a step surface of the insulating material to a bottom surface of the insulating material, and the multilayer assembly includes a conductive shield disposed within the insulating material to shield the conductive signal pathway; removing the sacrificial regions; and removing the base material.

Example 26 may include the subject matter of Example 25, and may further specify that the base material includes copper disposed on a core.

Example 27 may include the subject matter of any of Examples 25-26, and may further specify that forming the multilayer assembly includes: providing a first layer of photoresist; patterning the first layer of photoresist into a first sacrificial region and a first dielectric region; forming a first via in the first dielectric region; after forming the first via, providing a second layer of photoresist on the first layer of photoresist; patterning the second layer of photoresist into a second sacrificial region and a second dielectric region, wherein the second sacrificial region extends onto the first dielectric region; and forming a second via in the second dielectric region.

Example 28 may include the subject matter of any of Examples 25-27, and may further specify that the conductive shield includes a conductive shield plane having an opening through which the conductive signal pathway passes without contacting the conductive shield plane, and wherein forming the multilayer assembly includes forming the conductive shield plane by semi-additive patterning on a layer.

Example 29 may include the subject matter of any of Examples 25-28, and may further specify that the conductive shield includes first and second conductive shield pathways oriented parallel to the conductive signal pathway, and wherein the first and second conductive shield pathways each include at least one via.

Example 30 is a computing device, including: a circuit board; and an electronics package, coupled to the circuit board, including: a first die, a second die, an interposer including an insulating material having a stairstep structure with a first step surface, a second step surface, and a bottom surface, wherein a first conductive signal pathway extends from the first step surface to the bottom surface, a second conductive signal pathway extends from the second step surface to the bottom surface, the first die is coupled to the first conductive signal pathway at the first step surface, and the second die is coupled to the second conductive signal pathway at the second step surface, and a package substrate coupled to the bottom surface of the interposer, wherein the interposer includes a conductive shield disposed within the insulating material to shield the first and second conductive signal pathways, and wherein the first die or the second die includes a processing device.

Example 31 may include the subject matter of Example 30, and may further specify that the circuit board is a motherboard.

Example 32 may include the subject matter of any of Examples 30-31, and may further include one or more communication chips coupled to the circuit board.

The invention claimed is:

1. An interposer, comprising:
an insulating material having a stairstep structure with a first step surface, a second step surface, and a bottom surface to face a package substrate, wherein a first thickness of the insulating material between the first step surface and the bottom surface is greater than a second thickness of the insulating material between the second step surface and the bottom surface;
a conductive signal pathway extending from the first step surface to the bottom surface; and
a conductive shield disposed within the insulating material to shield the conductive signal pathway, wherein the conductive shield includes a conductive shield plane having an opening through which the conductive signal pathway passes without contacting the conductive shield plane.

2. The interposer of claim 1, wherein the conductive signal pathway is a first conductive signal pathway, the opening is a first opening, the interposer further includes a second conductive signal pathway extending from the second step surface to the bottom surface, and the conductive shield plane has a second opening through which the second conductive signal pathway passes.

3. The interposer of claim 1, wherein the conductive signal pathway includes a first via disposed substantially to one side of the conductive shield plane and a second via disposed substantially on an opposing side of the conductive shield plane.

4. The interposer of claim 3, wherein the conductive signal pathway includes a patterned conductive portion within the opening between the first and second vias.

5. The interposer of claim 1, wherein the conductive shield is electrically coupled to a reference voltage.

6. The interposer of claim 1, wherein the conductive signal pathway is in electrical contact with a solder bump at the bottom surface to couple the interposer to the package substrate.

7. The interposer of claim 1, wherein the conductive signal pathway includes a stack of vias.

8. The interposer of claim 1, wherein the conductive signal pathway is a first conductive signal pathway, the interposer includes a second conductive signal pathway extending from the second step surface to the bottom surface, and the conductive shield is to shield the second conductive signal pathway.

9. An electronics package, comprising:
a first die;
a second die;
an interposer including an insulating material having a stairstep structure with a first step surface, a second step surface, and a bottom surface, wherein a first conductive signal pathway extends from the first step surface to the bottom surface, a second conductive signal pathway extends from the second step surface to the bottom surface, the first die is coupled to the first conductive signal pathway at the first step surface, and the second die is coupled to the second conductive signal pathway at the second step surface; and
a package substrate coupled to the bottom surface of the interposer;
wherein the interposer includes a conductive shield disposed within the insulating material to shield the first and second conductive signal pathways, and wherein (1) the conductive shield includes a conductive shield plane having an opening through which the first conductive signal pathway passes without contacting the conductive shield plane, or (2) the conductive shield includes a conductive shield pathway oriented parallel to the first conductive signal pathway and a conductive reference pathway.

10. The electronics package of claim 9, wherein the first conductive signal pathway is in electrical contact with a solder bump at the bottom surface to couple to a first conductive contact on the package substrate, and the second conductive signal pathway is in electrical contact with a solder bump at the bottom surface to couple to a second conductive contact on the package substrate.

11. The electronics package of claim 9, wherein the first and second conductive signal pathways each include a stack of vias.

12. The electronics package of claim 9, wherein the first die includes a processing device or a memory device.

13. A computing device, comprising:
a circuit board; and
an electronics package, coupled to the circuit board, including:
a first die,
a second die,
an interposer including an insulating material having a stairstep structure with a first step surface, a second step surface, and a bottom surface, wherein a first conductive signal pathway extends from the first step surface to the bottom surface, a second conductive signal pathway extends from the second step surface to the bottom surface, the first die is coupled to the first conductive signal pathway at the first step surface, and the second die is coupled to the second conductive signal pathway at the second step surface, and a package substrate coupled to the bottom surface of the interposer, wherein the interposer includes a conductive shield disposed within the insulating material to shield the first and second conductive signal pathways, wherein the first die or the second die includes a processing device, and wherein (1) the conductive shield includes a conductive shield plane having an opening through which the first conductive signal pathway passes without contacting the conductive shield plane, or (2) the conductive shield includes a conductive shield pathway oriented parallel to the first conductive signal pathway and a conductive reference pathway.

14. The computing device of claim 13, wherein the circuit board is a motherboard.

15. The computing device of claim 13, further comprising one or more communication chips coupled to the circuit board.

16. An interposer, comprising:
an insulating material having a stairstep structure with a first step surface, a second step surface, and a bottom surface to face a package substrate, wherein a first thickness of the insulating material between the first step surface and the bottom surface is greater than a second thickness of the insulating material between the second step surface and the bottom surface;
a conductive signal pathway extending from the first step surface to the bottom surface; and
a conductive shield disposed within the insulating material to shield the conductive signal pathway, wherein the conductive shield includes a conductive shield pathway oriented parallel to the conductive signal pathway and a conductive reference pathway.

17. The interposer of claim 16, wherein the conductive shield pathway includes a stack of vias.

18. The interposer of claim 16, wherein the stairstep structure has a third step surface, a thickness of the insulating material between the first step surface and the second step surface is between the first and second thicknesses, and the conductive shield pathway extends between the third step surface and the bottom surface.

19. The interposer of claim 16, wherein the conductive shield pathway does not extend to the bottom surface.

20. The interposer of claim 16, wherein the conductive shield pathway is between, but does not extend to, the first step surface and the bottom surface.

21. The interposer of claim 16, wherein the conductive shield pathway is closer to the conductive signal pathway than the conductive reference pathway is to the conductive signal pathway.

22. The interposer of claim 16, wherein the conductive shield is electrically coupled to a reference voltage.

23. The interposer of claim 16, wherein the conductive signal pathway is in electrical contact with a solder bump at the bottom surface to couple the interposer to the package substrate.

24. The interposer of claim 16, wherein the conductive signal pathway includes a stack of vias.

25. The interposer of claim 16, wherein the conductive signal pathway is a first conductive signal pathway, the interposer includes a second conductive signal pathway extending from the second step surface to the bottom surface, and the conductive shield is to shield the second conductive signal pathway.

* * * * *

UNITED STATES PATENT AND TRADEMARK OFFICE
CERTIFICATE OF CORRECTION

PATENT NO. : 10,748,854 B2
APPLICATION NO. : 16/079534
DATED : August 18, 2020
INVENTOR(S) : Bok Eng Cheah et al.

It is certified that error appears in the above-identified patent and that said Letters Patent is hereby corrected as shown below:

In the Specification

In Column 1, under "CROSS-REFERENCE TO RELATED APPLICATION", Line 8, after "35" insert --U.S.C--

In Column 1, under "CROSS-REFERENCE TO RELATED APPLICATION", Line 12, delete "SHEILDING" and insert --SHIELDING--

Signed and Sealed this
Twenty-second Day of September, 2020

Andrei Iancu
*Director of the United States Patent and Trademark Office*